US012189476B2

(12) United States Patent
Kanter et al.

(10) Patent No.: US 12,189,476 B2
(45) Date of Patent: Jan. 7, 2025

(54) SOFT ERROR DETECTION AND CORRECTION FOR DATA STORAGE DEVICES

(71) Applicant: Kioxia Corporation, Tokyo (JP)

(72) Inventors: Ofir Kanter, Haifa (IL); Avi Steiner, Kiriat Motzkin (IL); Yasuhiko Kurosawa, Fujisawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 18/325,370

(22) Filed: May 30, 2023

(65) Prior Publication Data
US 2023/0305925 A1 Sep. 28, 2023

Related U.S. Application Data

(62) Division of application No. 17/154,661, filed on Jan. 21, 2021, now Pat. No. 11,693,733.

(51) Int. Cl.
*G06F 11/10* (2006.01)
*H03M 13/29* (2006.01)
(52) U.S. Cl.
CPC ...... *G06F 11/1068* (2013.01); *G06F 11/1004* (2013.01); *H03M 13/2906* (2013.01)
(58) Field of Classification Search
None
See application file for complete search history.

(56) References Cited

U.S. PATENT DOCUMENTS

| 9,229,853 | B2 | 1/2016 | Khan et al. |
| 9,413,392 | B1 | 8/2016 | Bentley et al. |
| 10,628,255 | B1* | 4/2020 | Steiner ............... H03M 13/093 |
| 11,082,069 | B1 | 8/2021 | Steiner et al. |
| 11,212,103 | B1* | 12/2021 | Mukherjee ........... H04L 9/3242 |
| 2009/0106626 | A1* | 4/2009 | Hou ................... H03M 13/1197 714/E11.017 |

(Continued)

FOREIGN PATENT DOCUMENTS

| CN | 110134619 A | 8/2019 |
| CN | 111081308 A | 4/2020 |

(Continued)

OTHER PUBLICATIONS

M. Tawada, S. Kimura, M. Yanagisawa and N. Togawa, "A bit-write reduction method based on error-correcting codes for non-volatile memories," The 20th Asia and South Pacific Design Automation Conference, Chiba, Japan, 2015, pp. 496-501, (Year: 2015).*

(Continued)

*Primary Examiner* — Daniel F. McMahon
(74) *Attorney, Agent, or Firm* — Foley & Lardner LLP

(57) ABSTRACT

Various implementations described herein relate to systems and methods for detecting soft errors, including but not limited to, errors introduced after reading a codeword from a non-volatile memory, and before providing data to a host. Embodiments can include generating the codeword from the non-volatile memory to obtain at least input data, and determining validity of the input data using a first signature after processing the input data through a data path. If it is determined that the input data is valid using the first signature, the input data is sent to a host.

18 Claims, 13 Drawing Sheets

(56) References Cited

U.S. PATENT DOCUMENTS

2018/0240134 A1    8/2018   Camenisch et al.
2020/0145195 A1    5/2020   Ma et al.
2021/0141685 A1*   5/2021   Li .................... G06F 11/0793

FOREIGN PATENT DOCUMENTS

TW              I531925  B    5/2016
WO      WO-2020/072129 A1    4/2020

OTHER PUBLICATIONS

Caplan, et al. "Trade-offs in execution signature compression for reliable processor systems," 2014 Design, Automation & Test in Europe Conference & Exhibition (DATE), Dresden, Germany, 2014, pp. 1-6, doi:10.7873/DATE .2014.106. (Year: 2014).

Kittur et al., "A LDPC Codes Based Authentication Scheme," 2020 Third ISDA Conference on Security and Privacy (ISEA-ISAP), 2020, pp. 63-70, doi: 10.1109/ISEA-ISAP49340.2020.235002.

Non-Final Office Action in U.S. Appl. No. 17/154,661 dated Sep. 15, 2022.

Notice of Allowance in U.S. Appl. No. 17/154,661 dated Feb. 23, 2023.

Office Action with a Search Report issued in a Taiwanese application No. 110149568 dated Dec. 19, 2022.

* cited by examiner

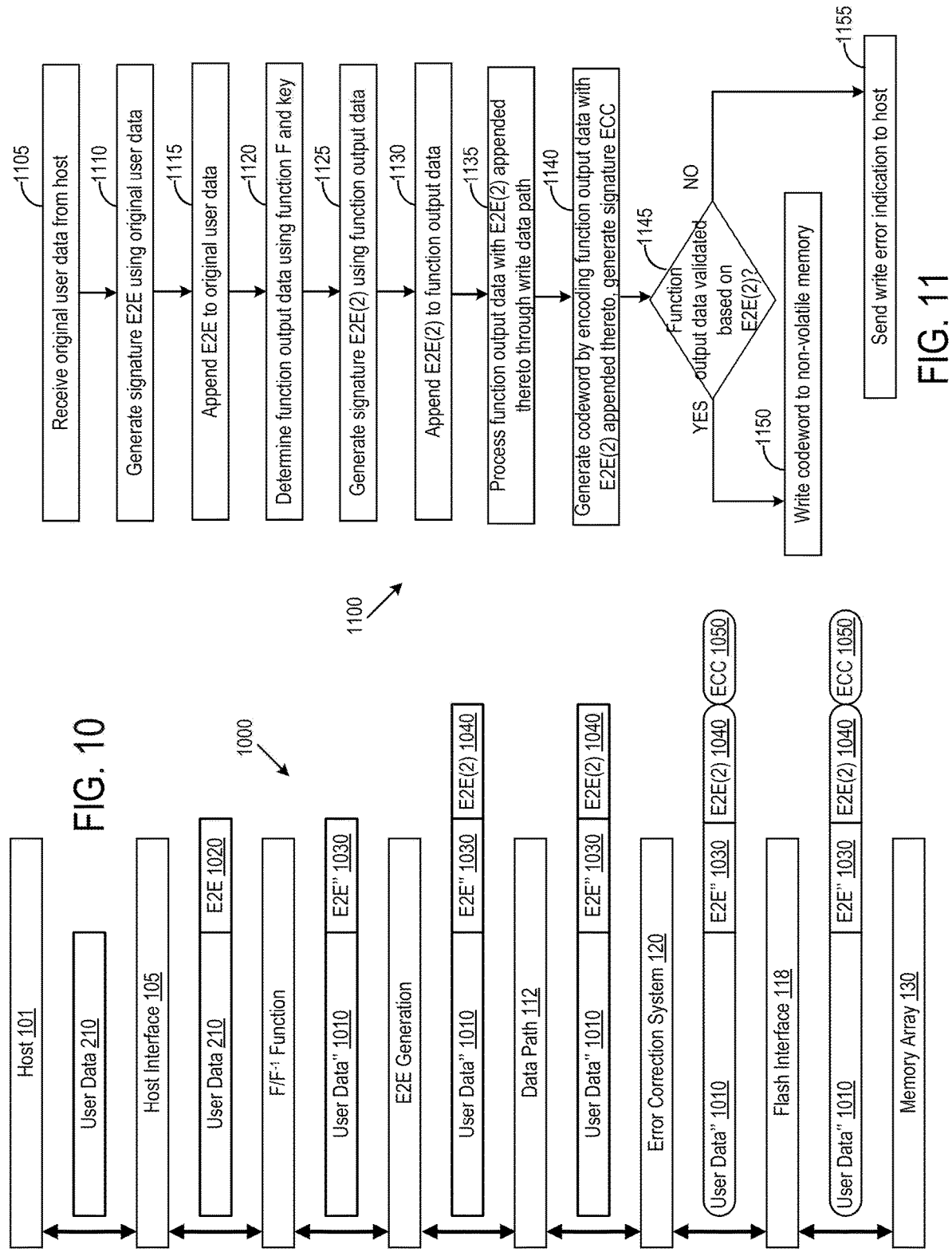

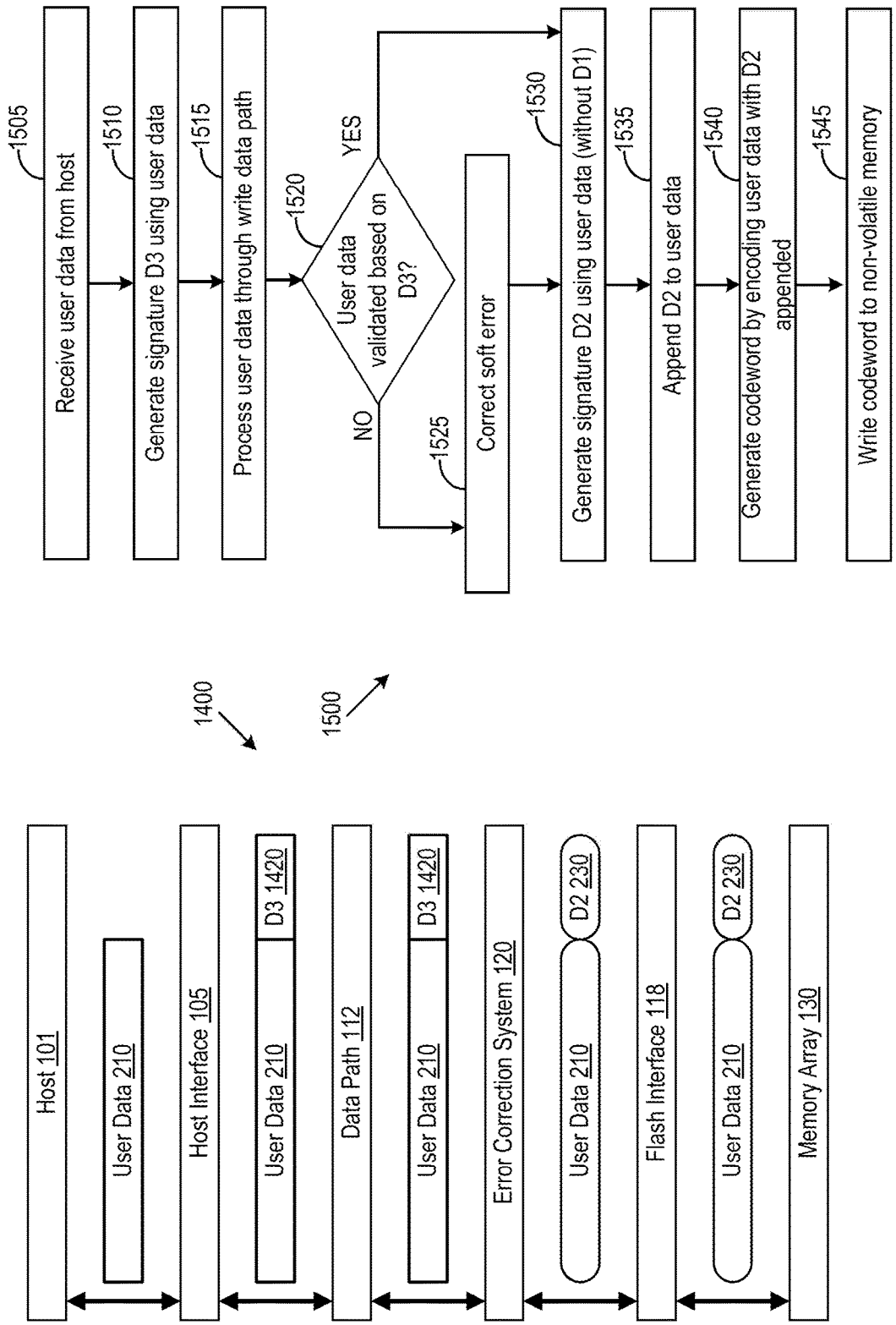

SOFT ERROR DETECTION AND CORRECTION FOR DATA STORAGE DEVICES

CROSS-REFERENCE TO RELATED PATENT APPLICATIONS

This application is a division of U.S. patent application Ser. No. 17/154,661, filed on Jan. 21, 2021, which is incorporated herein by reference in its entirety.

TECHNICAL FIELD

The present disclosure generally relates to systems, methods, and non-transitory processor-readable media for detecting and correcting soft errors in data storage devices.

BACKGROUND

In Solid State Drives (SSDs), hard errors can occur in non-volatile memory devices (e.g., NAND flash memory devices). Examples of hard errors include but are not limited to, programming errors, errors caused by reading with non-optimal thresholds, errors caused by retention/read-disturb stresses, and so on. To address such hard errors, the controller (e.g., an Error Correction Code (ECC) encoder) of the SSD can encode data being programmed to the non-volatile memory devices with one or more Error Correction Codes (ECC). The controller (e.g., an ECC decoder) can decode the encoded data being read from the non-volatile memory devices, to correct the hard errors.

On the other hand, soft errors are errors that can occur in components of the SSD other than the non-volatile memory devices. Soft errors can be caused by ionizing radiations (e.g., neutrons, alpha particles, and so on) which interact with silicon and cause charge deposition/collection, current spike, Single-Event Upset (SEU), Single-Event Transient (SET), and so on. Examples of SSD components that are prone to soft errors include but are not limited to, Static Random-Access Memory (SRAM), DRAM, digital logic (e.g., flip-flops, latches, combinatorial logic, Applicant-Specific Integrated Circuit (ASIC)) of the semiconductor device, and so on. Although soft errors occur less frequently than hard errors, system reliability can be affected by soft errors. For example, soft errors can affect the controller of the SSD, causing device hang, brick, or even data corruption.

SUMMARY

In some arrangements, systems, methods, and non-transitory computer-readable media relate to generating a first signature using input data received from a host, generating a codeword using at least the input data, determining validity of the input data after processing the input data through a data path, and in response to determining that the input data is valid, writing codeword to a non-volatile memory.

In some arrangements, systems, methods, and non-transitory computer-readable media relate to reading a codeword from a non-volatile memory, decoding the codeword to obtain at least input data, determining validity of the input data using a first signature after processing the input data through a data path, and in response to determining that the input data is valid using the first signature, sending the input data to a host.

BRIEF DESCRIPTION OF THE FIGURES

FIG. 10 is a block diagram illustrating an example soft error detection structure implementing two CRC signatures, according to some implementations.

FIG. 11 is a flowchart diagram illustrating an example method for writing data using the soft error detection structure of FIG. 10 implementing two CRC signatures, according to some implementations.

FIG. 14 is a block diagram illustrating an example soft error detection structure, according to some implementations.

FIG. 15 is a flowchart diagram illustrating an example method for writing data using the soft error detection structure of FIG. 14, according to some implementations.

DETAILED DESCRIPTION

Applicant recognizes that certain electronic components (e.g., SRAM, DRAM, flip-flops, latches, combinatorial logic, ASIC, and so on) are prone to soft errors, and thus components of the SSD on a data path between the host interface and the non-volatile memory are susceptible to soft errors. For example, soft errors can occur at components of the SSD including but not limited to, the controller (which includes ASIC, controller memory (e.g., SRAM, or another type of volatile memory device), flip-flops, and so on) and buffer/cache (which includes DRAM, SRAM, or another type of volatile memory device).

Arrangements disclosed herein relate to systems, methods, and non-transitory processor-readable media for detecting and correcting soft errors in a storage device to improve reliability across a complete data flow to/from a host interface. In some arrangements, soft errors are detected and corrected in real time on data paths of the storage device without increasing any overhead to the non-volatile memory device (e.g., NAND flash memory devices) while allowing detection and correction of soft errors before any write operation in which the data is written to the NAND flash memory devices. Joint optimization of data path protection and NAND storage area utilization for NAND memory controllers can be achieved. The soft error detection and correction mechanisms disclosed herein also allow sharing of the functionalities of soft errors detection and ECC error fix, and hence reduce redundancy data written to the non-volatile memory.

Figure 1:
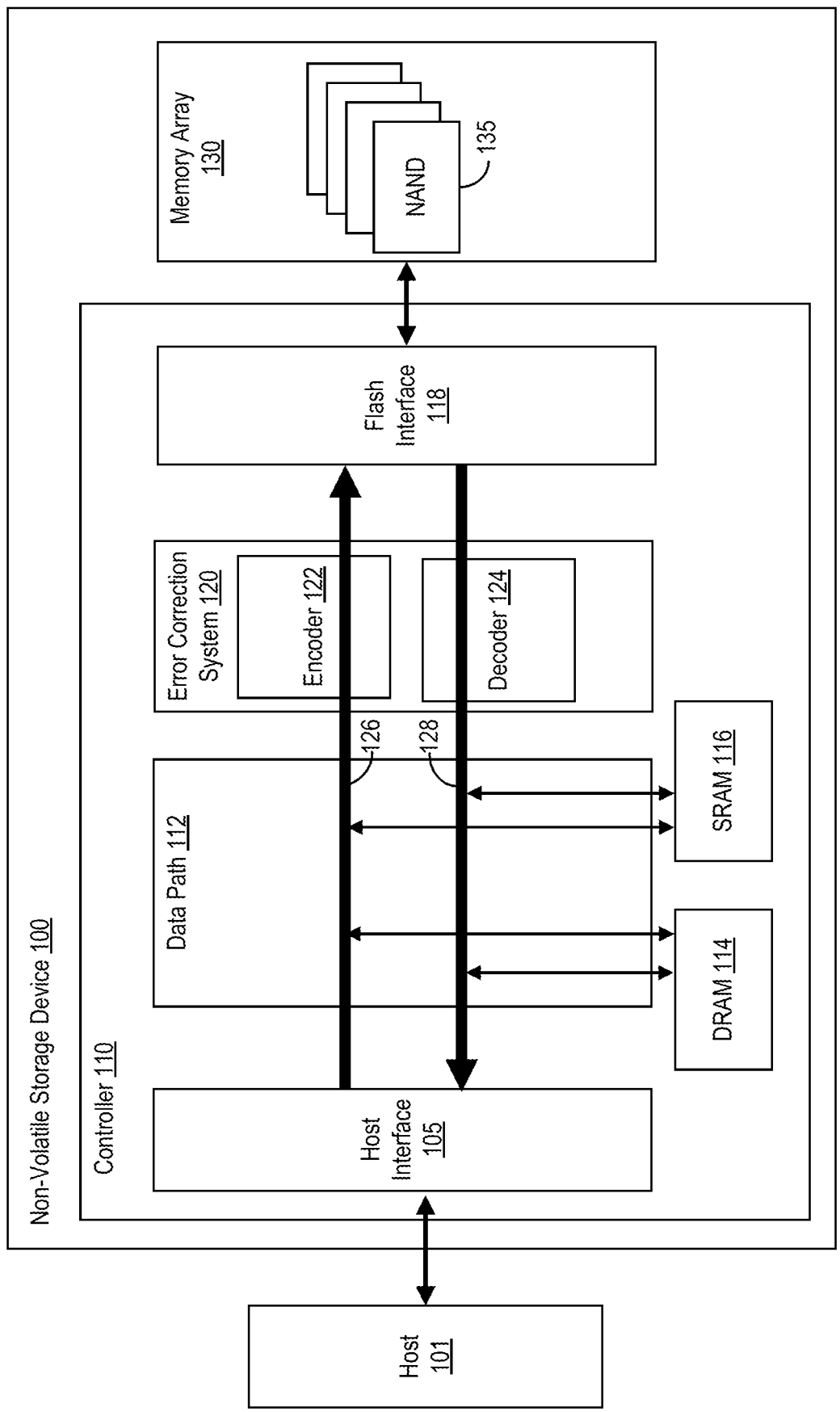
FIG. 1 is a block diagram illustrating an example system including a non-volatile storage device and a host, according to some implementations.

To assist in illustrating the present implementations, FIG. 1 shows a block diagram of a system including a non-volatile storage device 100 coupled to a host 101 according to some implementations. In some examples, the host 101 can be a user device operated by a user. The host 101 can include an Operating System (OS), which is configured to provision a filesystem and applications which use the filesystem. The filesystem communicates with the non-volatile storage device 100 (e.g., a controller 110 of the non-volatile storage device 100) over a suitable wired or wireless communication link, bus, or network to manage storage of data in the non-volatile storage device 100. In that regard, the filesystem of the host 101 sends data to and receives data from the non-volatile storage device 100 using a suitable interface to the communication link or network.

In some examples, the non-volatile storage device 100 is located in a datacenter (not shown for brevity). The datacenter may include one or more platforms or rack units, each of which supports one or more storage devices (such as but not limited to, the non-volatile storage device 100). In some implementations, the host 101 and non-volatile storage device 100 together form a storage node, with the host 101 acting as a node controller. An example of a storage node is a Kioxia Kumoscale storage node. One or more storage nodes within a platform are connected to a Top of Rack (TOR) switch, each storage node connected to the TOR via one or more network connections, such as Ethernet, Fiber Channel or InfiniBand, and can communicate with each other via the TOR switch or another suitable intra-platform communication mechanism. In some implementations, the non-volatile storage device 100 may be network attached storage devices (e.g. Ethernet SSDs) connected to the TOR switch, with host 101 also connected to the TOR switch and able to communicate with the storage devices 100 via the TOR switch. In some implementations, at least one router may facilitate communications among different non-volatile storage devices in storage nodes in different platforms, racks, or cabinets via a suitable networking fabric. Examples of the non-volatile storage device 100 include non-volatile devices such as but are not limited to, Solid State Drive (SSDs), Ethernet attached SSDs, a Non-Volatile Dual In-line Memory Modules (NVDIMMs), a Universal Flash Storage (UFS), a Secure Digital (SD) devices, and so on.

The non-volatile storage device 100 includes at least a controller 110 and a memory array 130. Other components of the non-volatile storage device 100 are not shown for brevity. The memory array 130 includes NAND flash memory devices 135. Each of the NAND flash memory devices 135 includes one or more individual NAND flash dies, which are Non-Volatile Memory (NVM) capable of retaining data without power. Thus, the NAND flash memory devices 135 refer to multiple NAND flash memory devices or dies within the flash memory device 100. Each of the NAND flash memory devices 135 includes one or more dies, each of which has one or more planes. Each plane has multiple blocks, and each block has multiple pages.

While the NAND flash memory devices 135 are shown to be examples of the memory array 130, other examples of non-volatile memory technologies for implementing the memory array 130 include but are not limited to, battery-backed Dynamic Random Access Memory (DRAM), Magnetic Random Access Memory (MRAM), Phase Change Memory (PCM), Ferro-Electric RAM (FeRAM), and so on.

Examples of the controller 110 include but are not limited to, an SSD controller (e.g., a client SSD controller, a datacenter SSD controller, an enterprise SSD controller, and so on), a UFS controller, or an SD controller, and so on.

The controller 110 can combine raw data storage in the plurality of NAND flash memory devices 135 such that those NAND flash memory devices 135 function as a single storage. The controller 110 can include microcontrollers, buffers, error correction systems, Flash Translation Layer (FTL), host interface, and flash interface modules. For example, as shown, the controller 110 includes a host interface 105, data path 112, error correction system 120, flash interface 118, DRAM 114, and SRAM 116. While shown as a part of the controller, in some implementations, one or more of the DRAM 114 or SRAM 116 can be in whole or in part external to the controller 110. Other components of the controller 110 are not shown. Such functions can be implemented in hardware, software, and firmware or any combination thereof. In some arrangements, the software/firmware of the controller 110 can be stored in the memory array 130 or in any other suitable computer readable storage medium.

The controller 110 includes suitable processing and memory capabilities (e.g., one or more Central Processing Units (CPUs)) for executing functions described herein, among other functions. As described, the controller 110 manages various features for the NAND flash memory devices 135 including, but not limited to, I/O handling, reading, writing/programming, erasing, monitoring, logging, error handling, garbage collection, wear leveling, logical to physical address mapping, data protection (encryption/decryption, Cyclic Redundancy Check (CRC)), ECC, data scrambling, and the like. Thus, the controller 110 provides visibility to the NAND flash memory devices 135.

The host 101 connects to the non-volatile storage device 100 (e.g., the controller 110) via the host interface 105, which conforms to a storage interface standard. Examples of the communication interface standard implemented for the host interface 105 include standards such as but not limited to, Serial Advanced Technology Attachment (SATA), Serial Attached SCSI (SAS), Peripheral Components Interconnect Express (PCIe), and so on. The host interface 105 (e.g., a command parser) can receive commands (e.g., write commands, read commands, trim/unmap/deallocate commands, and so on) from the host 101 and data associated thereof via the communication interface, and processes the commands with respect to the associated data.

For example, with respect to a write operation, the host interface 105 receives a write command and data to be written from the host 101. The host interface 105 parses the command and provides the data via the data path 112 (e.g., a write data path 126) to the flash interface 118. Along the write data path 126, the error correction system 120 (e.g., an encoder 122) encodes the data and provides the encoded data to the flash interface 118 along the rest of the write data path 126. The flash interface 118 programs the encoded data to the memory array 130.

With respect to a read operation, the flash interface 118 reads the data (corresponding to a logical address included in a read command from the host 101) from the memory array 130 and provides the data via the data path 112 (e.g., a read data path 128) to the host interface 105. Along the read data path 128, the error correction system 120 (e.g., a decoder 124) decodes the data and provides the decoded data to the host interface 105 along the rest of the read data path 128. The host interface 105 provides the data to the host 101.

The error correction system 120 can include or otherwise implement one or more ECC encoders (referred to as the encoder 122) and one or more ECC decoders (referred to as the decoder 124). The encoder 122 is configured to encode data (e.g., input payload) to be programmed to the memory array 130 (e.g., to the NAND flash memory devices 135) using at least one suitable ECC. The decoder 124 is configured to decode the encoded data to correct programming errors, errors caused by reading with non-optimal thresholds, errors caused by retention/read-disturb stresses, and so on, in connection with a read operation. To enable low-complexity processing, the error correction system 120 is implemented on hardware and/or firmware of the controller 110.

The data path 112 (e.g., the write data path 126 and the read data path 128) can be a physical or virtual/software channel or bus implemented on or by the controller 110. The data path 112 can carry data between the host interface 105 and the flash interface 118. The data path 112 can include one or more flip-flops and other components on a semiconductor device. While shown as continuous paths between the host interface 105 and the flash interface 118, a data path can be split in time by staging or buffering data temporarily in the DRAM 114 and/or the SRAM 116.

As shown, the data can be buffered temporarily in the buffer memory as part of its passage through the data path 112. Such buffer memory includes, for example, the DRAM 114 and the SRAM 116, which are both volatile memory. For example, along the write data path 126, data to be encoded by the encoder 122 can be temporarily stored (buffered or cached) in one or more of the DRAM 114 or the SRAM 116 before being provided to the encoder 122. As such, the one or more of the DRAM 114 or the SRAM 116 correspond to write buffers. Along the read data path 128, data decoded at the decoder 124 can be stored (buffered or cached) in one or more of the DRAM 114 or the SRAM 116 before being provided to the host interface 105. As such, the one or more of the DRAM 114 or the SRAM 116 correspond to read buffers.

In some examples, the SRAM 116 is a memory device local to or operatively coupled to the controller 110. For instance, the SRAM 116 can be an on-chip SRAM memory located on the chip of the controller 110. In some examples, the DRAM 114 can be implemented using a memory device of the storage device 100 external to the controller 110. For instance, the DRAM 114 can be DRAM located on a chip other than the chip of the controller 110. In some implementations, the buffer memory can be implemented using memory devices that are both internal and external to the controller 110 (e.g., both on and off the chip of the controller 110). For example, the buffer memory can be implemented using both an internal SRAM 116 and an external DRAM 114. In this example, the controller 110 includes an internal processor that uses memory addresses within a single address space and the memory controller, which controls both the internal SRAM 116 and external DRAM 114, selects whether to place the data on the internal SRAM 116 or the external DRAM 114 based on efficiency. In other words, the internal SRAM 116 and external DRAM 114 are addressed like a single memory. In other implementations, one of the internal SRAM 116 or the external DRAM 114 is used to buffer data. The DRAM 114 and the SRAM 116 are used to illustrate external and internal buffer memory of or coupled to the controller 110. Other types of buffer memories, volatile or non-volatile, can be used.

The flash interface 118 can include or operatively coupled to one or more non-volatile memory channel controllers (not shown), which are also referred to as flash controllers. The memory array 130 includes one or more non-volatile (non-transitory) NAND flash memory devices 135, each of which can include multiple banks of die coupled to the non-volatile memory channel controllers by flash memory buses such as memory channels. The channel controllers includes scheduler logic (e.g., a scheduler) that controls scheduling of memory commands/operations (e.g., write commands, read commands, garbage collection, trim/unmap/deallocate commands, and so on) with respect to the memory array 130. For example, the channel controllers take the memory commands from a flash interface layer of the flash interface 118 and schedule the commands on the individual memory channels, performing the memory bus control signaling and data transfers to the memory dies and checking the memory die status for the success or failure of the commands.

While non-volatile memory devices (e.g., the NAND flash memory devices 135) are presented as examples herein, the disclosed schemes can be implemented on any storage system or device that is connected to the host 101 over an interface, where such system temporarily or permanently stores data for the host 101 for later retrieval.

Radiations (e.g., neutrons, alpha particles, and so on) can cause soft errors to occur in semiconductor devices. Although soft errors are typically infrequent as compared to hard errors, soft errors can harm data correction and controller functionality due to a bit unexpectedly changing its logical value. Generally, two types of soft errors exist. A chip-level soft error is caused by a particle hitting the chip of the silicon die or a memory cell. A system-level soft error is caused by noise phenomenon affecting data while it is being processed (e.g., while it is on a bus). Within the controller 110, it may be difficult to determine the correct data once a soft error is introduced in the data.

Given that the data path 112 includes or is coupled to components (e.g., the DRAM 114, the SRAM 116, the flip-flops, the bus, and other components on a semiconductor device), the arrangements disclosed herein improve reliability of the non-volatile storage device 100 by improving detection and correction of soft errors occurs along the data path 112.

Conventionally, the controller 110 adds additional encoding to the data (in addition to the ECC protection provided by the error correction system 120) to detect and correct soft errors. An example of such additional encoding includes an End-to-End Error Detection (E3D) coding. When E3D coding is employed, in response to the host interface 105 receiving data (referred to as user data or information bits) to be written from the host 101 and before the data enters the data path 112, an E3D signature is generated using E3D coding. The signature is appended to the data as metadata. Once appended, the signature and the user data are treated as user data and handled accordingly. That is, during the write operation, both the user data and the E3D signature appended thereto are communicated along the write data path 126, encoded by the encoder 122, and programmed to the memory array 130 via the flash interface 118. In other words, conventionally, the encoder 112 generates the redundancy bits for both the user data and the E3D signature appended thereto, not just the user data alone. The codeword, which includes the user data, the E3D signature, and the redundancy bits, is programmed to the memory array 130.

In response to receiving a read command for the same data from the host, the flash interface 118 reads the codeword from the memory array 130. The flash interface 118 provides the codeword to the decoder 124 via the read data path 128. The decoder 124 decodes the codeword and corrects any hard errors. The decoded data, which includes the user data and the E3D signature appended thereto, is communicated along the rest of the read data path 128 to the host interface 105. Just before the decoded data is provided to the host 101, the E3D signature is checked to validate the user data. In response to detecting an error during E3D validation, a read error indication is provided to host 101. In response to receiving the read error indication, the host 101 may attempted to perform another read operation.

Such conventional schemes do not adequately address soft errors in the controller 110. The impact of soft errors depend on locations within the controller 110 at which the soft errors occur. In one example, during a read or write operation, errors occurring between the encoder 122 and the flash interface 118, between the interface 118 and the decoder 124, at the flash interface 118, and at the memory array 130 can be handled by the error correction system 120. In particular, soft errors occurring between the encoder 122 and the flash interface 118, between the interface 118 and the decoder 124, and at the flash interface 118 can be detected and fixed by ECC encoding and decoding at the error correction system 120, like errors occurring in the memory array 130. Assuming the error correction system 120 functions as intended, such errors should not exist when the host 101 receives the data.

In another example, during a read operation, a soft error can occur along the read data path 128 after the data has been decoded and fixed by the decoder 124 and before the data reaches the host interface 105. The conventional E3D schemes may detect such error and provide a read error indication to the host 101. The host 101 can re-read the data and expect the correct data given that the data stored to the memory array 130 is correct, and the soft error occurred during the read operation. Such soft errors can likewise occur during a garage collection operation, in which valid memory pages within a memory block are first read, then written back to a different, freshly erased memory block, before the original memory block is erased, thus freeing up the space occupied by invalid memory pages in that block. In a conventional system, such an error in garbage collection becomes a constant error once the error is encoded and written to the memory array 130. Even though the conventional E3D schemes may detect such errors and provide a read error indication to the host 101, re-reading the data by the host 101 would yield the error again. In that regard, the error can never be fixed.

In yet another example, during a write operation, a soft error can occur along the write data path 126 before the data has been encoded by the encoder 122. Given that the soft error occurs before ECC protection, the encoder 122 encodes erroneous data with the soft error, and the error correction system 120 cannot fix this soft error. The encoded erroneous data is written to the memory array 130. During a subsequent read operation, even though the conventional E3D schemes may detect an error, a subsequent re-read operation will obtain the same error. Accordingly, the conventional schemes are inadequate to fix such soft errors. Such soft errors can likewise occur during a garbage collection operation, where valid memory pages in a memory block are read correctly, but then encoded data written with soft errors into the freshly erased memory block.

Figure 2:
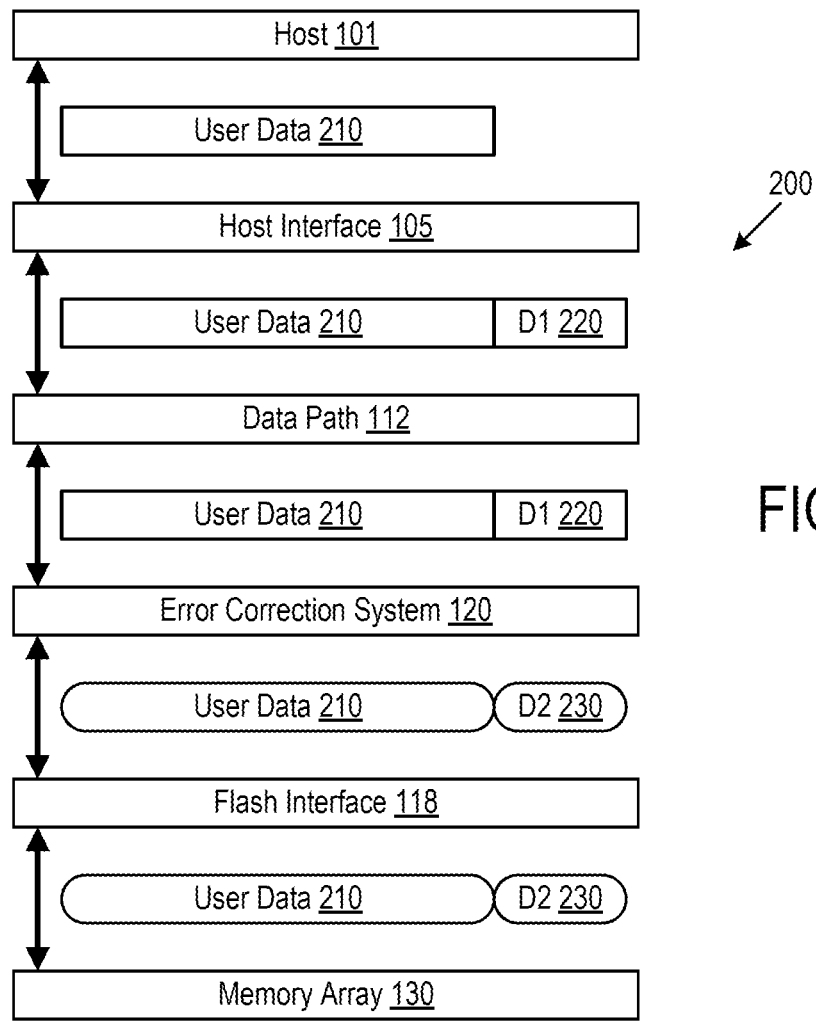
FIG. 2 is a block diagram illustrating an example soft error detection structure, according to some implementations.
Figure 3:
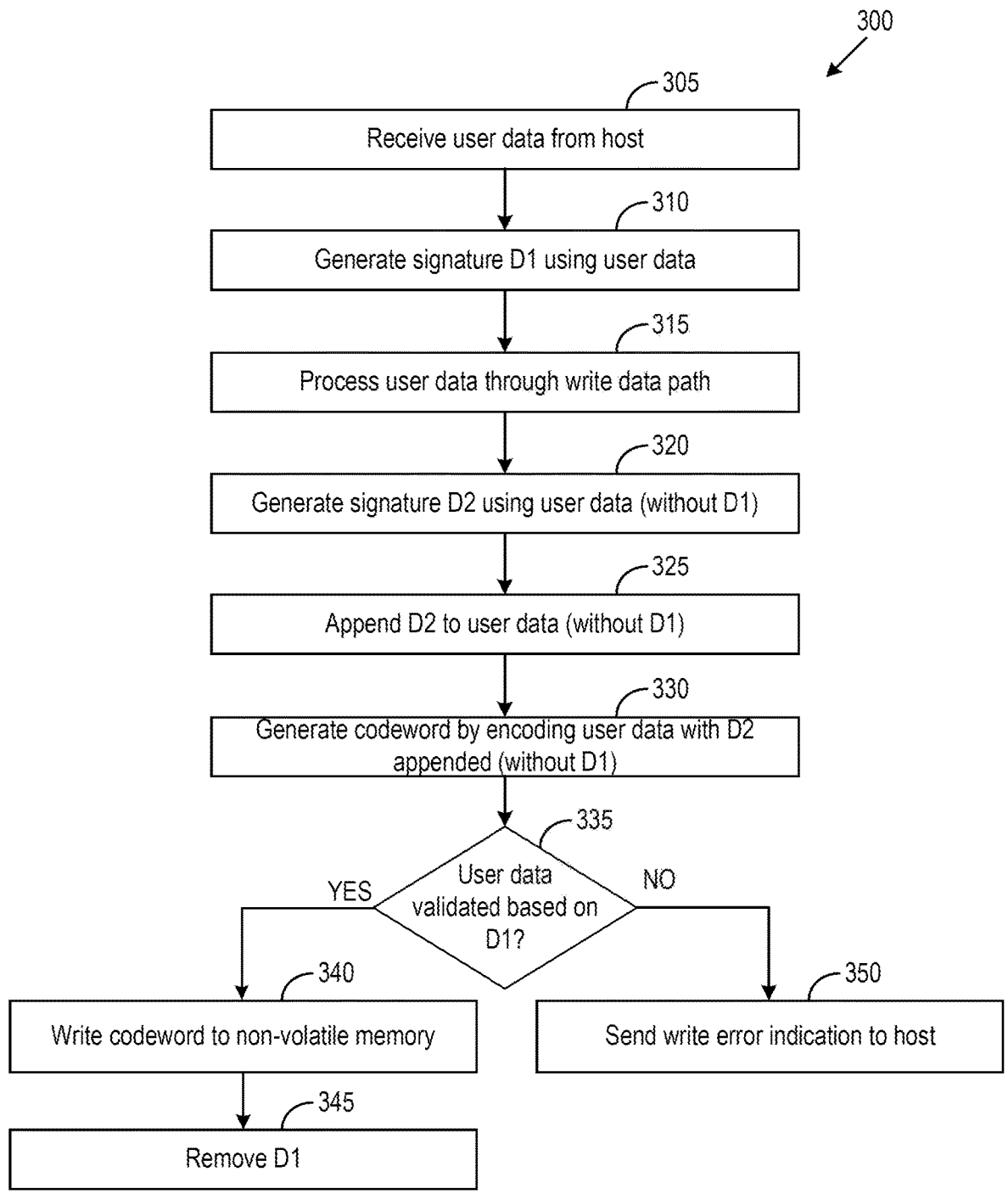
FIG. 3 is a flowchart diagram illustrating an example method for writing data using the soft error detection structure of FIG. 2, according to some implementations.

Arrangements disclosed herein address deficiencies of conventional soft error protection schemes. In that regard, FIG. 2 is a block diagram illustrating an example soft error detection structure 200, according to some implementations. FIG. 3 is a flowchart diagram illustrating an example method 300 for writing data using the soft error detection structure 200, according to some implementations. Referring to FIGS. 1-3, the soft error detection structure 200 illustrates an example mechanism by which data is processed and protected between the host 101 and the memory array 130. The method 300 is performed by the controller 110 in a write operation.

At 305, the controller 110 (e.g., the host interface 105) receives user data 210 to be written from the host 101. The user data 210 can also be referred to as information bits. At 310, the controller 110 generates a signature D1 220 using the user data 210, in response to receiving the user data 210 at the host interface 105. The signature D1 220 can also be referred to as an End-to-End (E2E) error protection signature. In some examples, D1 220 is generated using the host interface 105.

At 315, the controller 110 processes the user data 210 through the data path 112 (the write data path 126). For example, the user data 210 can be temporarily stored in a write buffer (e.g., in one or more of the DRAM 114 or the SRAM 116), and can be communicated via the bus/channel of the write data path 126 until the data reaches the error correction system 120. The error correction system 120 (the encoder 122) receives the user data 210 and D1 220 via the write data path 126.

At 320, the controller 110 (e.g., the encoder 122) generates a signature D2 230 using the user data 210 (without D1 220), as part of an encoding process. The encoder 122 appends D2 230 to the user data 210 (without D1 220), at 325. Furthermore, the encoder 112 generates, using one or more suitable ECCs, a codeword using the user data 210 (input payload) with D2 230 (redundancy bits) appended thereto (without D1 220), at 330. Such a codeword is formed by a systematic code, which is identified by the fact that the user data 210 is embedded in the output codeword. One form of which includes the user data 210 being concatenated with the redundancy bits D2 230. Such a codeword formed by a systematic code enables the user data 210 to be accessed and validated directly, without having to explicitly decode the codeword, which would be the case with a non-systematic code.

At 335, the controller 110 (e.g., the encoder 122) determines whether the user data 210 is validated using D1 220. In some examples, 335 is performed after the user data 210 is encoded and the codeword is generated. Validating the user data 210 using D1 220 corresponds to determining that no soft errors had occurred while the user data 210 is being processed along the write data path 126, between the host interface 105 and the encoder 122. On the other hand, failure to validate the user data 210 using D1 220 corresponds to detecting that at least one soft error had occurred while the user data 210 is being processed along the write data path 126, between the host interface 105 and the encoder 122. In response to determining that based on D1 220, a copy of the user data 210 is not validated (335:NO), the controller 110 sends a write error indication to the host 101, through the host interface 105, at 350. The host 101 can attempt to rewrite the user data 210 by sending, to the host interface 105, the user data 210 again with another write command.

In response to determining that, based on D1 220, a copy of the user data 210 is validated (the same as what had been received from the host at 305) (335:YES), the controller 110 writes the codeword to non-volatile memory (e.g., the memory array 130), at 340. For example, the encoder 122 provides the codeword to the flash interface 118, while schedules the write operation that writes the codeword to one or more of the NAND flash memory devices 135. At 345, the controller 110 removes D1 220 from memory after 335:YES or after 340. In that regard, D1 220 is not stored in the memory array 130 after 335:YES. Accordingly, what is stored in the memory array 130 is a codeword generated from the user data 210 and D2 230, and the codeword is not generated based on D1 220.

Figure 4:
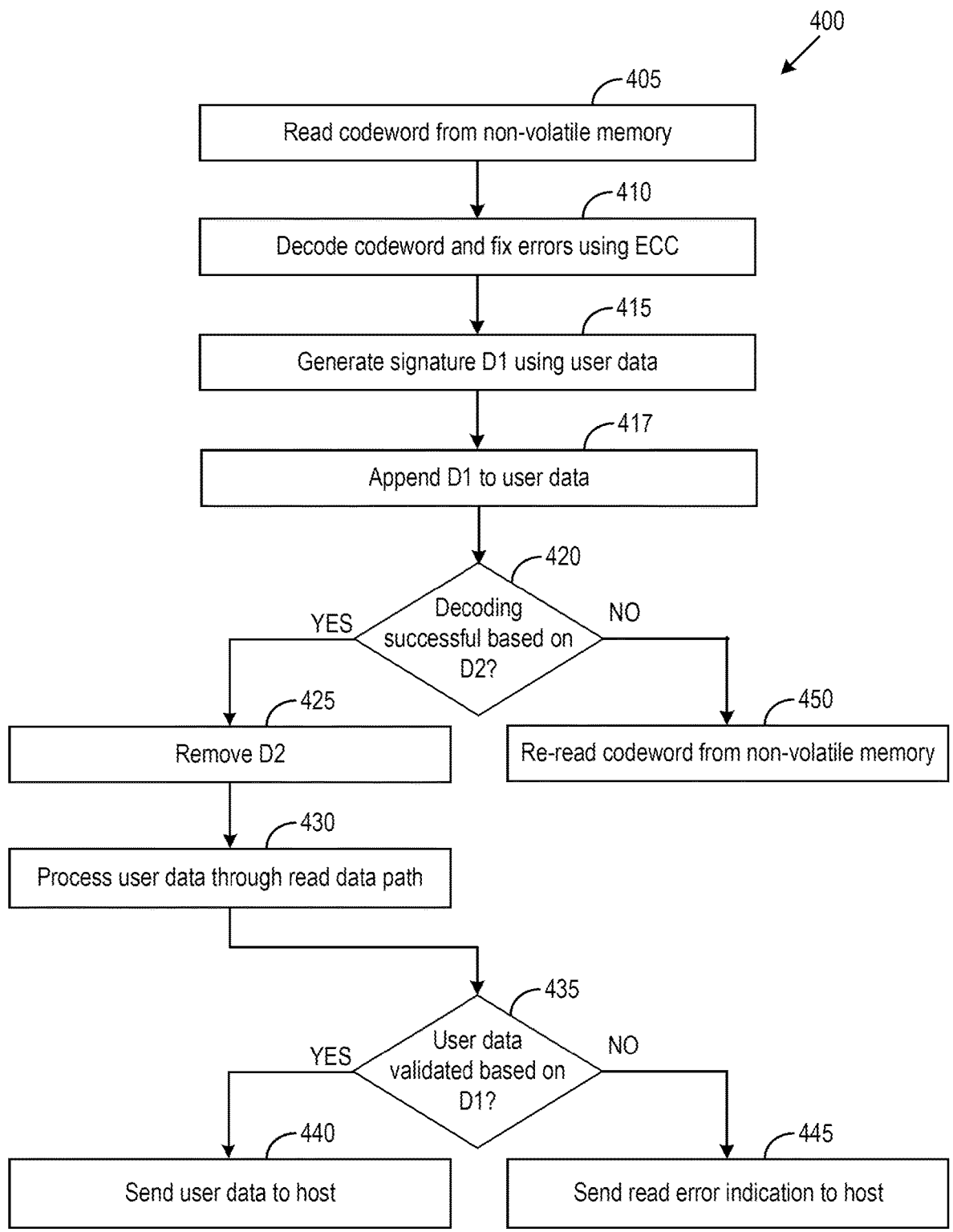
FIG. 4 is a flowchart diagram illustrating an example method for reading data using the soft error detection structure of FIG. 2, according to some implementations.

FIG. 4 is a flowchart diagram illustrating an example method 400 for reading data using the soft error detection structure 200, according to some implementations. Referring to FIGS. 1-4, the method 400 is performed by the controller 110 in a read operation.

At 405, the controller 110 (e.g., the flash interface 118) reads the codeword from non-volatile memory (e.g., the memory array 130), in response to a read command received from the host 101. At 410, the controller 110 (e.g., the error correction system 120) decodes the codeword and fixes errors using ECC. For example, the decoder 124 can decode the codeword using the one or more ECCs used by the encoder 122 in the encoding process, to fix any errors in the user data 210 with D2 230 appended thereto. After error detection and correction are performed using ECC, the user data 210 and D2 230 can be identified.

After error detection and correction are performed using ECC, the controller 110 generates D1 220 using the user data 210 (without D2 230), at 415. D1 220 is appended to the user data 210 (without D2 230), at 417. The mechanism by which D1 220 is generated at 415 can be the same as that by which D1 220 is generated at 310.

At 420, the controller 110 (e.g., the error correction system 120) determines whether decoding is successful based on D2 230. In some examples, 420 is performed after errors are detected and fixed using ECC (at 410) and after D1 220 is generated. This validation process does not involve D1 220 given that D2 230 is generated using the user data 210 without D1 220. Given that an example of D2 230 is CRC redundancy bits, the decoder 124 can determine whether decoding is successful using the CRC redundancy bits. In response to determining that based on D2 230, the decoding is not successful (420:NO), at 450, the controller 110 (the flash interface 118) can perform a read-retry operation in which the same codeword is again read from the same physical address in the memory array 130, and the method 400 returns at 405.

On the other hand, in response to determining that decoding is successful based on D2 230 (420:YES), the controller 110 (the decoder 124) removes D2, at 425. The controller 110 processes the user data 210 through the data path 112 (the read data path 128), at 430. For example, the user data 210 can be temporarily stored in a read buffer (e.g., in one or more of the DRAM 114 or the SRAM 116), and can be communicated via the bus/channel of the read data path 128 until the data reaches the host interface 105. The host interface 105 receives the user data 210 and D1 220 via the read data path 128.

At 435, the controller 110 determines whether the user data 210 is validated using D1 220. Validating the user data 210 using D1 220 corresponds to determining that no soft errors had occurred while the user data 210 is being processed along the read data path 128, between the host interface 105 and the decoder 124. On the other hand, failure to validate the user data 210 using D1 220 corresponds to detecting that at least one soft error had occurred while the user data 210 is being processed along the read data path 128, between the host interface 105 and the decoder 124. In response to determining that based on D1 220, the user data 210 is not validated (435:NO), the controller 110 sends a read error indication to the host 101, through the host interface 105, at 445. In response to determining that, based on D1 220, the user data 210 is validated (the same as what had been received from the host at 305) (435:YES), the controller 110 sends the user data 210 back to the host 101, through the host interface 105, at 440.

In garbage collection in which data is erased in the unit of a block, a block to be erased may contain pages with valid data. Thus, in garbage collection, valid data is read from one or more pages of a block to be erased and then written to one or more pages on another, freshly erased block. In other words, garbage collection includes a read operation and a write operation.

The read operation in connection with garbage collection can incorporate 405-425 and 450. For example, the codeword can be read from the non-volatile memory at 405, where the codeword corresponds to valid data to be moved to another block. At 410, the codeword is decoded and errors are fixed using ECC. At 415, D1 220 is generated using user data 210. At 320, the user data 210 is evaluated based on D2 230. In response to determining that the user data 210 is valid using D2 230 (420:YES), D2 is removed at 425. On the other hand, in response to determining that the user data 210 is not valid using D2 230 (420:NO), the codeword is re-read from the non-volatile memory, at 450.

The write operation in connection with garbage collection can likewise incorporate 320-345. The write operation follows the read operation. For example, D2 230 can be generated using the user data 210 (without D1 220), at 320. At 325, D2 230 is appended to the user data 210 (without D1 220). At 330, a codeword is generated by encoding the user data 210 with D2 230 (without D1 220). At 335, the user data 210 is evaluated using D1, which was generated at 415. In response to determining that the user data 210 is valid using D1 220 (335:YES), the codeword is written to another block in the non-volatile memory, at 340. On the other hand, in response to determining that the user data 210 is not valid using D1 220 (335:NO), the codeword is re-read from the non-volatile memory, instead of sending any write error indication to the host 101.

Accordingly, soft errors are detected before being written to the memory array 130 in a write operation and in a garbage collection operation, given that the soft errors are detected in real time. In response to detecting soft errors, the controller 110 requests that the host 101 resend the user data 210.

Figure 5:
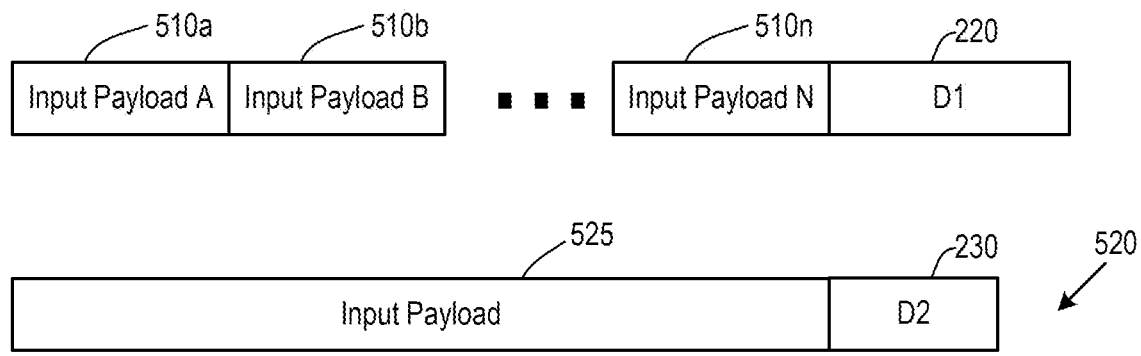
FIG. 5 is a block diagram illustrating example mechanisms for generating signatures, according to some implementations.

FIG. 5 is a block diagram illustrating example mechanisms for generating signatures and redundancy bits, according to some implementations. Referring to FIGS. 1-5, FIG. 5 illustrates example mechanisms for generating signature D1 220 and redundancy bits D2 230.

The encoder 122 can encode input bits 520 to generate a codeword to be stored in the memory array 130. The input bits 520 includes input payload 525 (which corresponds to the information bits of the user data 210) and D2 230 appended to the input payload 525, when a systematic code is employed. In some examples, the input payload 525 includes the information bits and redundancy bits introduced by the host 101 for RAID or erasure encoding. An example of D2 230 is systematic ECC bits with extra CRC bits. The bits of D2 230 can also be referred to as "outer parity bits," given that the ECC+CRC encoding can be viewed as an outer encoding process. D 230 can also be referred to as redundancy bits generated by the encoder 122. The ECC bits are used for the decoding and error correction process, while the CRC bits are used for validating whether the decoding and error correction process has been successful, since it is possible for ECC decoding to mis-decode a codeword. For example, the decoder 124 may use some of the redundancy bits to fix error and some other ones of the redundancy bits to validate a successful decoding process by CRC. Examples of ECC codes include, but are not limited to, Bose-Chaudhurri-Hocquenghem (BCH) and Low Density Parity Check (LDPC) codes.

The controller 110 can generate D1 220 using the user data 210. The information bits of the user data 210 can be divided into multiple (N) input payloads, referred to as input payload A 510a, input payload 510b, . . . , and input payload N 510n. The size of each of the input payloads 510a-510n depend on data granularity of the host 101.

In some arrangements, the host 101 can send the user data 210 in a plurality of frames, the size of each frame is commensurate with the size of each of the input payloads 510a-510n. For example, the data granularity of the host 101 is 512 bytes. In order to transfer the user data 210 which has a size of 4096 bytes, 8 frames (e.g., N=8) of the user data 210 is transferred from the host 101 to the host interface 105. The controller 110 can determine a signature (e.g., having a size of 2 bytes) for each frame (e.g., each of the input payloads 510a-510n). Accordingly, D1 220 includes a plurality of signatures, each of which is generated using a frame (e.g., one of the input payloads 510a-510n) of the user data 210. In this example, D1 220 has a size of 16 bytes. An example of D1 220 is CRC redundancy bits.

The data granularity of the error correction system 120 (e.g., the encoder 122 and/or the decoder 124) and/or of the ECC employed may be different from that of the host 101. For example, the encoder 122 and the decoder 124 can encode and decode data based on a frame size (or unit) of 4096 bytes. In the example in which the user data 210 has a size of 4096 bytes, the encoder 112 can generate D2 230 (e.g., having 8 bytes) for all bits of the user data 210. Accordingly, the algorithms for generating D1 220 and D2 230 are different, due to the data granularity (frame size) of the host 101 may be different from the data granularity (frame size) of the error correction system 120 and/or ECC. As shown, the size of D1 220 and the size of D2 230 are different. An example of D2 230 is LDPC redundancy bits with CRC check bits.

A code rate is defined by a ratio of information content (referred to as a payload, e.g., the input payload 525) of a codeword to an overall size of the codeword. For example, for a codeword that contains k information bits and r redundancy bits, the code rate $R_c$ is defined by:

$$R_c = \frac{k}{k+r}. \quad (1)$$

Lower code rate (more redundancy bits) correspond to higher error correction capability. The arrangements disclosed herein improve ECC error correction capability given that the D1 220 is not stored in the memory array 130. This allows the encoder 122 to generate more ECC redundancy bits for error correction, thus lowering the actual code rate.

In some arrangements, D1 can be shared with the error correction system 120 such that D1 can function as the signature for both the soft error detection and ECC decoding verification. In such arrangements, the encoder 122 may not need to include CRC bits in D2.

In some implementation, the original user data 210 received from the host 101 can pass through a function F, which outputs function output data which is different from the original user data 210. In other words, the function F modifies the original user data 210. The function output data is passed through the write data path 126, encoded at the encoder 122, stored (as a codeword) in the memory array 130, read (as the codeword) from the memory array 130, decoded by the decoder 124, and passed through the read data path 128. Before the user data 210 is provided to the host 101, the function output data is passed through an inverse function $F^{-1}$ which is the inverse of function F to generate the original user data 210. Examples of the function include but not limited to, an encryption function (e.g., Advanced Encryption Standard (AES)) used to encrypt the original user data 210, so that an encrypted version (e.g., the function output data) of the original user data 210 is stored in the memory array 130. In another example, the function can be a scrambler function that scrambles the original user data 210 to determined scrambled user data, which is stored in the memory array 130 (as a codeword) instead of the original user data to prevent certain detrimental patterns in flash memory.

In cases involving the function F, in some arrangements, the host interface 105 generates D1 220 or 620 using the original user data 210 received from the host 101. Thus, in order to perform validation of the user data 210 (e.g., at 335, 435, 730, and 825), the original user data 210 is restored, so that the validation is performed on the original user data 210. In order to do this, the output function data is passed through the inverse function $F^{-1}$ to generate the original user data 210, which can be validated. In some other arrangements, to avoid this, two different end to end signatures (e.g., CRCs E2E1 and E2E2) are used. Arrangements using a single CRC and two CRCs are disclosed.

Figure 7:
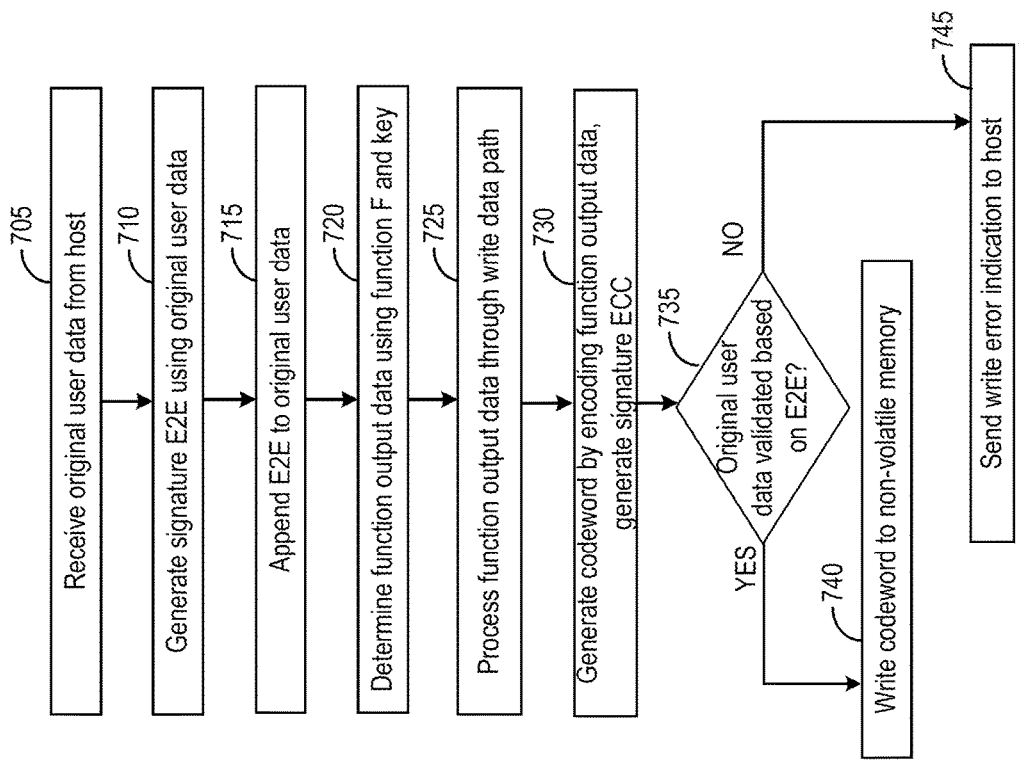
FIG. 7 is a flowchart diagram illustrating an example method for writing data using the soft error detection structure of FIG. 6 implementing a single CRC signature, according to some implementations.
Figure 6:
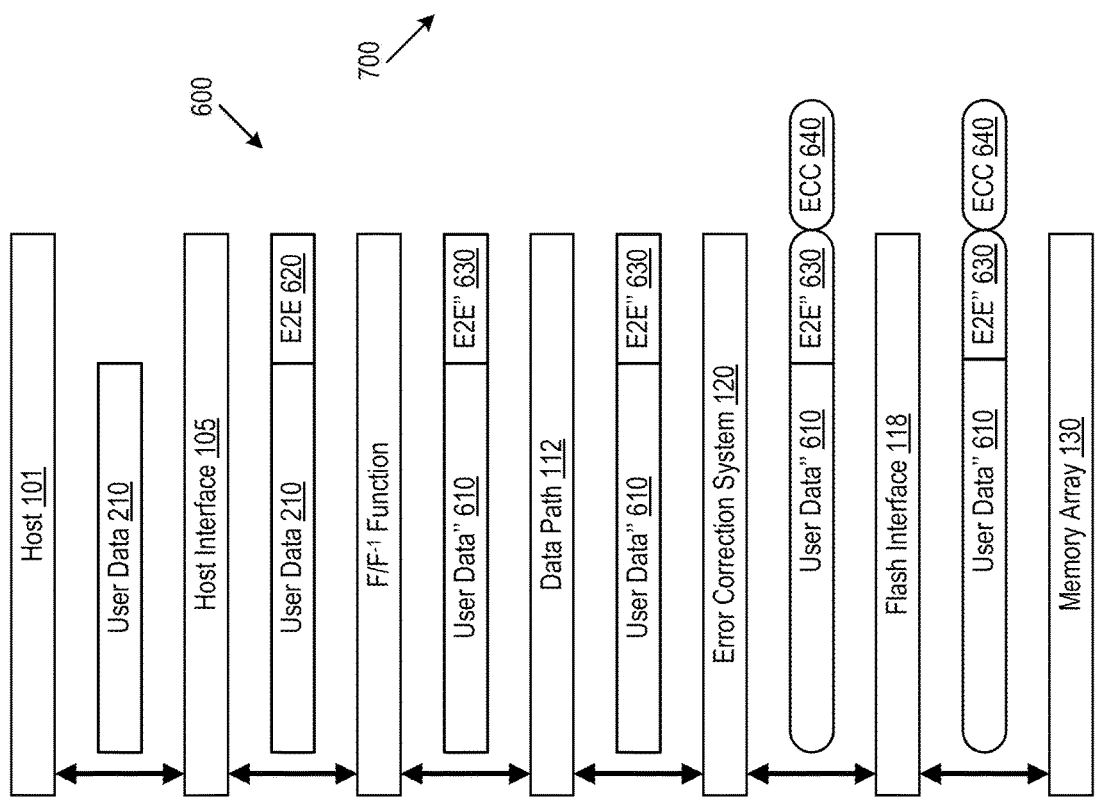
FIG. 6 is a block diagram illustrating an example soft error detection structure implementing a single CRC signature, according to some implementations.

In that regard, FIG. 6 is a block diagram illustrating an example soft error detection structure 600 using a single CRC signature, according to some implementations. FIG. 7 is a flowchart diagram illustrating an example method 700 for writing data using the soft error detection structure 600, according to some implementations. Referring to FIGS. 1-7, the soft error detection structure 600 illustrate an example mechanism by which data is processed and protected between the host 101 and the memory array 130. The method 700 is performed by the controller 110 in a write operation.

At 705, the controller 110 (e.g., the host interface 105) receives from the host 101, the original user data 210 to be written. The original user data 210 can also be referred to as information bits. At 710, the controller 110 generates a signature E2E 620 using the original user data 210, in response to receiving the original user data 210 at the host interface 105. The E2E 620 can be an ECC signature is, for example, a CRC redundancy bits, for error protection. In some examples, E2E 620 is generated using the host interface 105. At 715, E2E 620 is appended to the original user data.

At 720, the controller 110 (e.g., the host interface 105) determines function output data using a function F and a key. For example, the original user data 210 with E2E 620 appended thereto can pass through the function F, which outputs the function output data based on the key. The function output data includes user data" 610 and E2E" 630. The user data" 610 is different from the original user data 210, and E2E" 630 is different from E2E 620. Examples of the function F include but are not limited to, an encryption function, a scrambling function, and so on.

At 725, the controller 110 processes the function output data (including the user data" 610 and E2E" 630) through the data path 112 (the write data path 126). For example, the function output data can be temporarily stored in a write buffer (e.g., in one or more of the DRAM 114 or the SRAM 116), and can be communicated via the bus/channel of the write data path 126 until the function output data reaches the error correction system 120. The error correction system 120 (the encoder 122) receives the function output data via the write data path 126.

At 730, the encoder 112 generates, using one or more suitable ECCs, a codeword using the function output data (input payload) In some examples, as a part of the encoding process of 710, the encoder 112 generating a signature (denoted as ECC 640) using the function output data. The signature ECC 640 can be CRC redundancy bits. In some examples, the signature ECC 640 is appended to the encoded function output data (including the user data" 610 and E2E" 630) as a part of the codeword.

At 735, the controller 110 (e.g., the encoder 122) determines whether the original user data 210 is validated using E2E 620. In some examples, 735 is performed after the function output data is encoded and the codeword is generated. In particular, at 735, a copy of the function output data is passed through an inverse function $F^{-1}$ (which is the inverse of function F) to generate the original user data 210 and E2E 620 using the same key. The original user data 210 is validated using the signature E2E 620. Validating the original user data 210 corresponds to determining that no soft errors had occurred while the function output data is being processed along the write data path 126, between the host interface 105 and the encoder 122. On the other hand, failure to validate the original user data 210 corresponds to detecting that at least one soft error had occurred while the function output data is being processed along the write data path 126, between the host interface 105 and the encoder 122. In response to determining that based on $F^{-1}$, a copy of the original user data 210 is not validated (735:NO), the controller 110 sends a write error indication to the host 101, through the host interface 105, at 745. The host 101 can attempt to rewrite the user data 210 by sending, to the host interface 105, the user data 210 again with another write command.

In response to determining that, based on $F^{-1}$, a copy of the original user data 210 is validated (735:YES), the controller 110 writes the codeword to non-volatile memory (e.g., the memory array 130), at 740. The codeword includes the encoded function output (including the user data" 610 and E2E" 630) with the signature ECC 640 appended thereto. For example, the encoder 122 provides the codeword to the flash interface 118, while schedules the write operation that writes the codeword to one or more of the NAND flash memory devices 135. In that regard, the function output data and ECC 640 are stored in the memory array 130 after 735:YES, as a part of the codeword.

Figure 8:
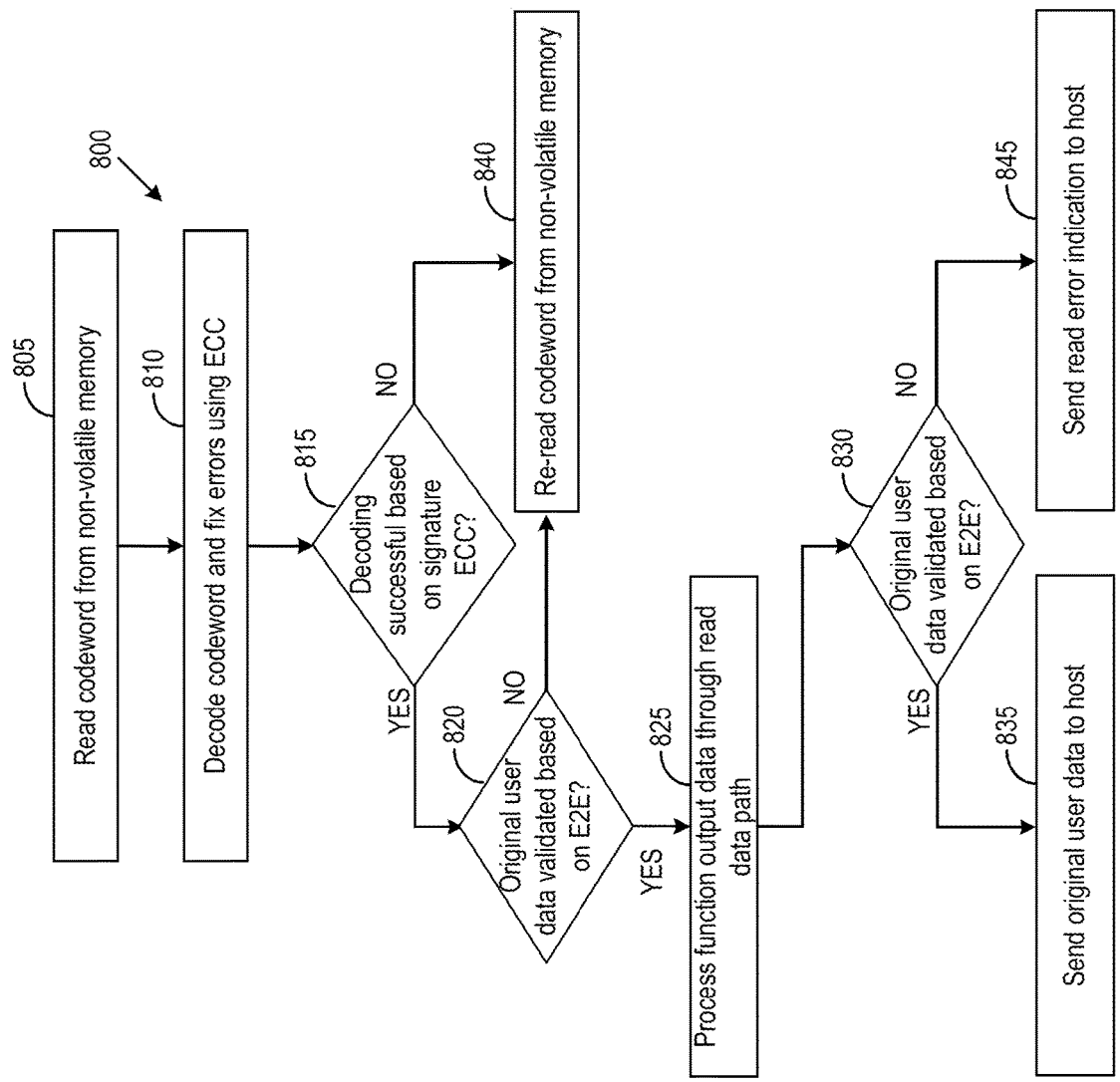
FIG. 8 is a flowchart diagram illustrating an example method for reading data using the soft error detection structure of FIG. 6 implementing a single CRC signature, according to some implementations.

FIG. 8 is a flowchart diagram illustrating an example method 800 for reading data using the soft error detection structure 600 using a single CRC signature, according to some implementations. Referring to FIGS. 1-8, the method 800 is performed by the controller 110 in a read operation.

At 805, the controller 110 (e.g., the flash interface 118) reads the codeword from non-volatile memory (e.g., the memory array 130), in response to a read command received from the host 101. The codeword includes the encoded function output (including the user data" 610 and E2E" 630) with the appended ECC 640 thereto. At 810, the controller 110 (e.g., the error correction system 120) decodes the codeword and fixes errors using ECC. For example, the decoder 124 can decode the codeword using the one or more ECCs used by the encoder 122 in the encoding process, to fix any errors in the function output data. After error detection and correction are performed using ECC, the function output data (including the user data" 610 and E2E" 630) can be identified.

After error detection and correction are performed using ECC, at 815, the controller 110 (e.g., the error correction system 120) determines whether decoding is successful based on the signature ECC 640. In some examples, 815 is performed after errors are detected and fixed using ECC (at 810). This validation process involves the signature ECC 640, which is generated at 730. The decoder 124 can determine whether decoding is successful using the CRC redundancy bits of signature ECC 640. In response to determining that based on ECC 640, the decoding is not successful (815:NO), at 840, the controller 110 (the flash interface 118) can perform a read-retry operation in which the same codeword is again read from the same physical address in the memory array 130, and the method 800 returns at 805.

On the other hand, in response to determining that decoding is successful based on ECC 640 (815:YES), the controller 110 (e.g., the decoder 124) determines whether the original user data 210 is validated using E2E 620 at 820. In some examples, 820 is performed after the function output data is decoded successfully. In other words, the decoded function output data (including the user data" 610 and E2E" 630) is passed through an inverse function $F^{-1}$ (which is the inverse of function F) to generate the original user data 210 and E2E 620 using the same key. The original user data 210 is validated using the signature E2E 620. In response to determining that based on $F^{-1}$, a copy of the original user data 210 is not validated (820:NO), at 840, the controller 110 (the flash interface 118) can perform a read-retry operation in which the same codeword is again read from the same physical address in the memory array 130, and the method 800 returns at 805.

On the other hand, in response to determining that based on $F^{-1}$, a copy of the original user data 210 is validated (820:YES), the controller 110 (the decoder 124) processes the function output data through the data path 112 (the read data path 128), at 825. For example, the function output data can be temporarily stored in a read buffer (e.g., in one or more of the DRAM 114 or the SRAM 116), and can be communicated via the bus/channel of the read data path 128 until the data reaches the host interface 105. The host interface 105 receives the function output data via the read data path 128.

At 830, the controller 110 (e.g., the decoder 124) determines whether the original user data 210 is validated using E2E 620. For example, a copy of the function output data is passed through an inverse function $F^{-1}$ (which is the inverse of function F) to generate the original user data 210 and E2E 620 using the same key. The original user data 210 is validated using the signature E2E 620. Validating the original user data 210 using signature E2E 620 corresponds to determining that no soft errors had occurred while the function output data is being processed along the read data path 128, between the host interface 105 and the decoder 124. On the other hand, failure to validate the original user data 210 using signature E2E 620 corresponds to detecting that at least one soft error had occurred while the function output data is being processed along the read data path 128, between the host interface 105 and the decoder 124. In response to determining that based on $F^{-1}$, the original user data 210 is not validated (830:NO), the controller 110 sends a read error indication to the host 101, through the host interface 105, at 845. In response to determining that, based on $F^{-1}$, the user data 210 is validated (the same as what had been received from the host at 705) (830:YES), the controller 110 sends the original user data 210 back to the host 101, through the host interface 105, at 835.

Figure 9:
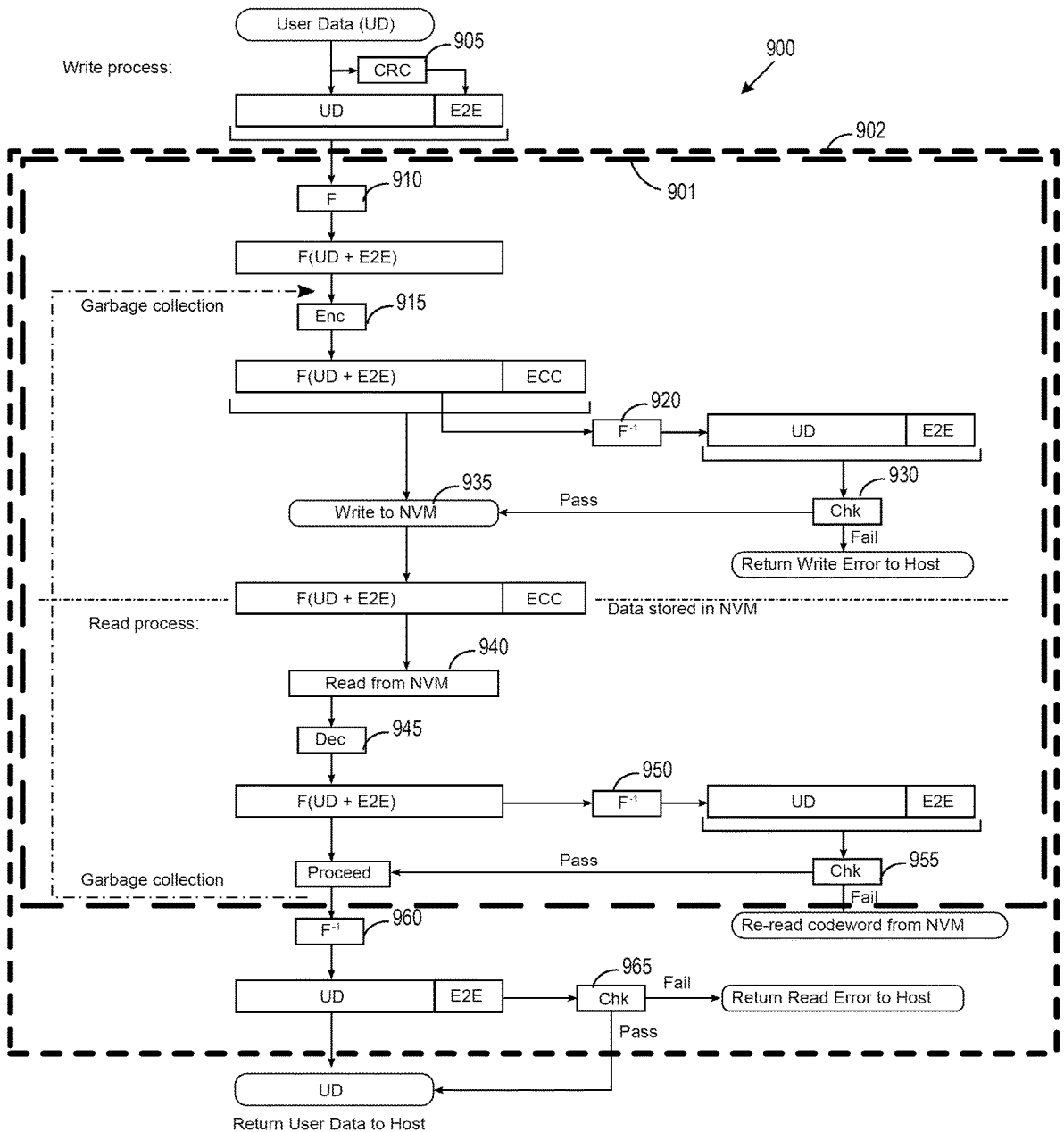
FIG. 9 is a flowchart diagram illustrating an example method for writing and reading data using the soft error detection structure of FIG. 6 implementing a single CRC signature, according to some implementations.

FIG. 9 is a flowchart diagram illustrating an example method 900 for writing and reading data using the soft error detection structure 600 of FIG. 6 using a single CRC signature, according to some implementations. Referring to FIGS. 1-9, the method 900 is a particular implementation of the methods 700 and 800. The methods 700, 800, and 900 provide permanent soft error protection (for user data 210 communicated within components/elements within the portion denoted within box 901) as well as E2E soft error protection (for user data 210 communicated within components/elements within the portion denoted within box 902). The methods 700, 800, and 900 improve code rate, given that only a single CRC is added to the user data 210. In addition, soft errors can be detected before written to flash (during a write operation and garbage collection) and become constant errors.

As shown in FIG. 9, in a write process, user data, or UD (e.g., the user data 210) is received from the host 101. A CRC process is performed to generate signature E2E (e.g., E2E 620), at 905. E2E is appended to the UD. At 910, UD with E2E appended thereto is inputted into the function F to generate a function output using a key. The function output of function F is denoted as F(UD+E2E), which corresponds to the function output that includes user data" 610 and E2E" 630. The function output is moved along the data path as described herein, until it reaches the error correction system 120 (e.g., the encoder 122), which performs an encode process at 915 using F(UD+E2E) as input to encode F(UD+E2E) and to generate the ECC signature (e.g., ECC 640). A copy of F(UD+E2E) is run through the inverse function $F^{-1}$ using the same key at 920, to generate the original UD and the E2E signature. The original UD is verified using E2E signature at 930. In response to determining that the UD is invalid (fail), a write error is returned to the host 101. In response to determining that the UD is valid (pass), encoded F(UD+E2E) with ECC signature is written to the NVM (e.g., the memory array 120) as a codeword, at 935. The write process ends.

In a read process, the codeword is read from the NVM at 940 and decoded at 945. After errors are fixed according to the ECC, F(UD+E2E) is determined. F(UD+E2E) is run through the inverse function $F^{-1}$ using the same key at 950, to generate the original UD and the E2E signature. The original UD is verified using E2E signature at 955. In response to determining that the UD is invalid (fail), the codeword is re-read from the NVM. In response to determining that the UD is valid (pass), F(UD+E2E) proceeds through the data path, until it reaches the host interface 105. Then, at 960, F(UD+E2E) is run through the inverse function $F^{-1}$ using the same key, to generate the original UD and the E2E signature. The original UD is verified using E2E signature at 965. In response to determining that the UD is invalid (fail), a read error is sent to the host 101. On the other hand, in response to determining that the UD is valid (pass), the UD is sent to the host 101, and the read process ends In a garbage collection process, F(UD+E2E) is to be written to a different, freshly erased block after being read. Thus, in response to passing the check at 955, F(UD+E2E) is to be encoded at 915. Blocks 920, 930, 935 are then performed as described. As shown, the permanent soft error protection 901 protects against soft errors (e.g., in the garbage collection process) occurring up to the point of the initial write can get (permanently) propagated as each garbage collection process is performed on the UD.

FIG. 10 is a block diagram illustrating an example soft error detection structure 1000 using a two CRC signatures, according to some implementations. FIG. 11 is a flowchart diagram illustrating an example method 1100 for writing data using the soft error detection structure 1000, according to some implementations. Referring to FIGS. 1-11, the soft error detection structure 1000 illustrate an example mechanism by which data is processed and protected between the host 101 and the memory array 130. The method 1100 is performed by the controller 110 in a write operation.

At 1105, the controller 110 (e.g., the host interface 105) receives from the host 101, the original user data 210 to be written. The original user data 210 can also be referred to as information bits. At 1110, the controller 110 generates a signature E2E 1020 using the original user data 210, in response to receiving the original user data 210 at the host interface 105. The E2E 1020 can be an ECC signature is, for example, a CRC redundancy bits, for error protection. In some examples, E2E 1020 is generated using the host interface 105. The signature E2E 1020 is a first E2E signature. At 1115, E2E 620 is appended to the original user data.

At 1120, the controller 110 (e.g., the host interface 105) determines function output data using a function F and a key. For example, the original user data 210 with E2E 1020 appended thereto can pass through the function F, which outputs the function output data based on the key. The function output data includes user data" 1010 and E2E" 1030. The user data" 1010 is different from the original user data 210, and E2E" 1030 is different from E2E 1020. Examples of the function F include but are not limited to, an encryption function, a scrambling function, and so on.

At 1125, the controller 110 generates a signature E2E(2) 1040 using the function output data (including the user data" 1010 and the E2E" 1030). The E2E(2) 1040 can be an ECC signature is, for example, a CRC redundancy bits, for error protection. In some examples, E2E(2) 1040 is generated using the host interface 105. The signature E2E(2) 1030 is a second E2E signature. At 1130, E2E(2) 1040 is appended to the function output data.

At 1135, the controller 110 processes the function output data (including the user data" 1010 and E2E" 1030) with E2E(2) 1040 appended thereto through the data path 112 (the write data path 126). For example, the function output data with E2E(2) 1040 appended thereto can be temporarily stored in a write buffer (e.g., in one or more of the DRAM 114 or the SRAM 116), and can be communicated via the bus/channel of the write data path 126 until the function output data with E2E(2) 1040 appended thereto reaches the error correction system 120. The error correction system 120 (the encoder 122) receives the function output data with E2E(2) 1040 appended thereto via the write data path 126.

At 1140, the encoder 112 generates, using one or more suitable ECCs, a codeword using the function output data with E2E(2) 1040 appended thereto (input payload). In some examples, as a part of the encoding process of 1140, the encoder 112 generating a signature (denoted as ECC 1050) using the function output data with E2E(2) 1040 appended thereto. The signature ECC 1050 can be CRC redundancy bits. In some examples, the signature ECC 1050 is appended to the encoded function output data (including the user data" 610 and E2E" 630) with E2E(2) 1040 appended thereto, as a part of the codeword.

At 1145, the controller 110 (e.g., the encoder 122) determines whether the function output data is validated using E2E(2) 1040. In some examples, 1145 is performed after the function output data with E2E(2) 1040 appended thereto is encoded and the codeword is generated. In particular, at 1145, a copy of the function output data (including the user data" 1010 and E2E" 1030) is validated using the signature E2E(2) 1040. Validating the function output data corresponds to determining that no soft errors had occurred while the function output data is being processed along the write data path 126, between the host interface 105 and the encoder 122. On the other hand, failure to validate the function output data corresponds to detecting that at least one soft error had occurred while the function output data is being processed along the write data path 126, between the host interface 105 and the encoder 122. In response to determining a copy of the function output data is not validated (1145:NO), the controller 110 sends a write error indication to the host 101, through the host interface 105, at 1155. The host 101 can attempt to rewrite the user data 210 by sending, to the host interface 105, the user data 210 again with another write command.

In response to determining that a copy of the function output data is validated (1145:YES), the controller 110 writes the codeword to non-volatile memory (e.g., the memory array 130), at 1150. The codeword includes the encoded function output (including the user data" 1010 and E2E" 1030) with the signature E2E(2) 1040 and ECC 1050 appended thereto. For example, the encoder 122 provides the codeword to the flash interface 118, while schedules the write operation that writes the codeword to one or more of the NAND flash memory devices 135. In that regard, the function output data, E2E(2) 1040, and ECC 1050 are stored in the memory array 130 after 1145:YES, as a part of the codeword.

Figure 12:
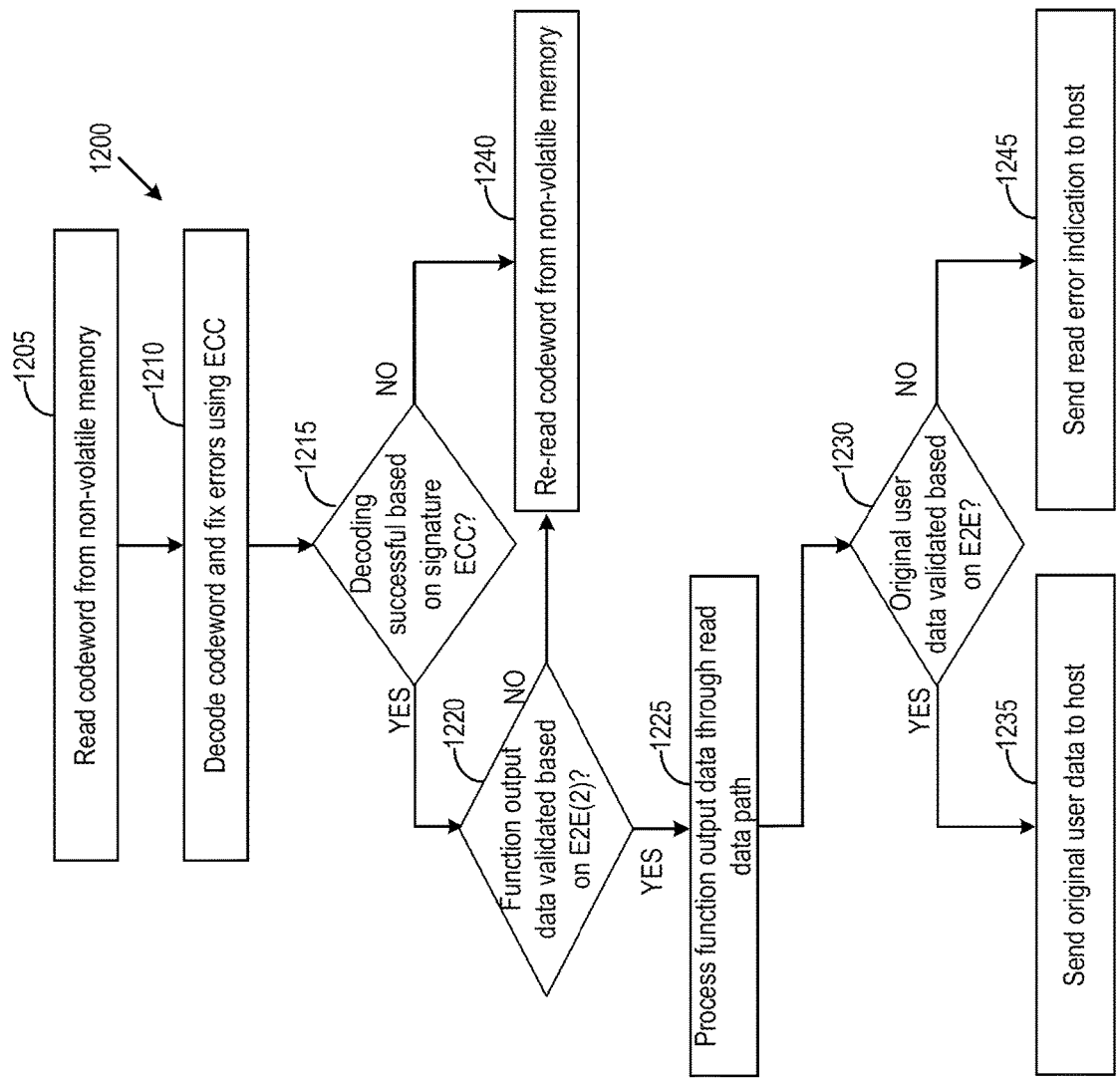
FIG. 12 is a flowchart diagram illustrating an example method for reading data using the soft error detection structure of FIG. 10 implementing two CRC signatures, according to some implementations.

FIG. 12 is a flowchart diagram illustrating an example method 1200 for reading data using the soft error detection structure 1000 using a two CRC signatures, according to some implementations. Referring to FIGS. 1-12, the method 1200 is performed by the controller 110 in a read operation.

At 1205, the controller 110 (e.g., the flash interface 118) reads the codeword from non-volatile memory (e.g., the memory array 130), in response to a read command received from the host 101. The codeword includes the encoded function output (including the user data" 1210, E2E" 1030), E2E(2) 1040, and ECC 1050. At 1210, the controller 110 (e.g., the error correction system 120) decodes the codeword and fixes errors using ECC. For example, the decoder 124 can decode the codeword using the one or more ECCs used by the encoder 122 in the encoding process, to fix any errors in the function output data. After error detection and correction are performed using ECC, the function output data (including the user data" 1010 and E2E" 1030) with E2E(2) 1040 appended thereto can be identified.

After error detection and correction are performed using ECC, at 1215, the controller 110 (e.g., the error correction system 120) determines whether decoding is successful based on the signature ECC 1050. In some examples, 1050 is performed after errors are detected and fixed using ECC (at 1210). This validation process involves the signature ECC 1050, which is generated at 1140. The decoder 124 can determine whether decoding is successful using the CRC redundancy bits of signature ECC 1050. In response to determining that based on ECC 1050, the decoding is not successful (1215:NO), at 1240, the controller 110 (the flash interface 118) can perform a read-retry operation in which the same codeword is again read from the same physical address in the memory array 130, and the method 1200 returns at 1205.

On the other hand, in response to determining that decoding is successful based on ECC 1050 (1215:YES), the controller 110 (e.g., the decoder 124) determines whether the function output data (including the user data" 1210, E2E" 1030) is validated using E2E(2) 1050 at 1220. In some examples, 1220 is performed after the function output data with E2E(2) 1040 appended thereto is decoded successfully. The function output data is validated using the signature E2E(2) 1040. In response to determining that a copy of the function output data is not validated (1220:NO), at 1240, the controller 110 (the flash interface 118) can perform a read-retry operation in which the same codeword is again read from the same physical address in the memory array 130, and the method 800 returns at 1205.

On the other hand, in response to determining that a copy of the function output data is validated (1220:YES), the controller 110 (the decoder 124) processes the function output data through the data path 112 (the read data path 128), at 1225. For example, the function output data can be temporarily stored in a read buffer (e.g., in one or more of the DRAM 114 or the SRAM 116), and can be communicated via the bus/channel of the read data path 128 until the data reaches the host interface 105. The host interface 105 receives the function output data via the read data path 128.

At 1230, the controller 110 (e.g., the decoder 124) determines whether the original user data 210 is validated using E2E 1020. For example, a copy of the function output data is passed through an inverse function $F^{-1}$ (which is the inverse of function F) to generate the original user data 210 and E2E 1020 using the same key. The original user data 210 is validated using the signature E2E 1020. Validating the original user data 210 using signature E2E 1020 corresponds to determining that no soft errors had occurred while the function output data is being processed along the read data path 128, between the host interface 105 and the decoder 124. On the other hand, failure to validate the original user data 210 using signature E2E 1220 corresponds to detecting that at least one soft error had occurred while the function output data is being processed along the read data path 128, between the host interface 105 and the decoder 124. In response to determining that the original user data 210 is not validated (1230:NO), the controller 110 sends a read error indication to the host 101, through the host interface 105, at 1245. In response to determining that the user data 210 is validated (the same as what had been received from the host at 1105) (1230:YES), the controller 110 sends the original user data 210 back to the host 101, through the host interface 105, at 1235.

Figure 13:
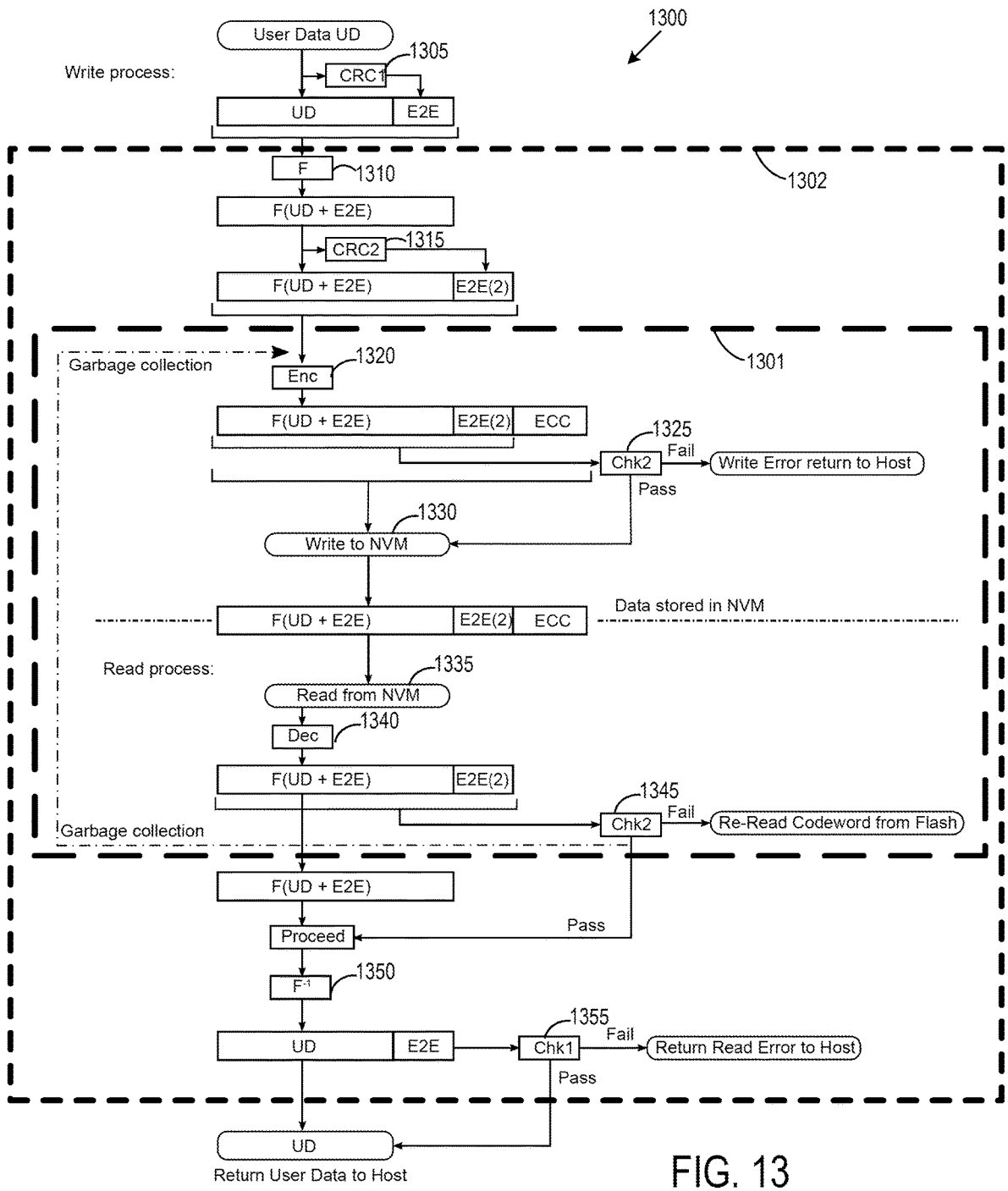
FIG. 13 is a flowchart diagram illustrating an example method for writing and reading data using the soft error detection structure of FIG. 10 implementing two CRC signatures, according to some implementations.

FIG. 13 is a flowchart diagram illustrating an example method 1300 for writing and reading data using the soft error detection structure 1000 of FIG. 7 using two CRC signatures, according to some implementations. Referring to FIGS. 1-13, the method 1300 is a particular implementation of the methods 1100 and 1200. The methods 1100, 1200, and 1300 provide permanent soft error protection (for user data 210 communicated within components/elements within the portion denoted within box 1301) as well as E2E soft error protection (for user data 210 communicated within components/elements within the portion denoted within box 1302). The methods 1100, 1200, and 1300 is efficient given that the inverse function $F^{-1}$ is run a fewer number of times. In addition, soft errors can be detected before written to flash (during a write operation and garbage collection) and become constant errors.

As shown in FIG. 13, in a write process, user data, or UD (e.g., the user data 210) is received from the host 101. A first CRC process (CRC1) is performed on the UD to generate signature E2E (e.g., E2E 1020), at 1305. E2E is appended to the UD. At 1310, UD with E2E appended thereto is inputted into the function F to generate a function output using a key. The function output of function F is denoted as F(UD+E2E), which corresponds to the function output that includes user data" 1010 and E2E" 1030. A second CRC process (CRC2) is performed on the UD to generate signature E2E(2) (e.g., E2E(2) 1040), at 1315. E2E(2) is appended to the function output F(UD+E2E).

The function output with E2E(2) appended thereto is moved along the data path as described herein, until it reaches the error correction system 120 (e.g., the encoder 122), which performs an encode process at 1320 using F(UD+E2E) with E2E(2) appended thereto as input to encode F(UD+E2E) with E2E(2) appended thereto and to generate the ECC signature (e.g., ECC 1050). A copy of F(UD+E2E) is verified using E2E(2) signature at 1325. In response to determining that F(UD+E2E) is invalid (fail), a write error is returned to the host 101. In response to determining that F(UD+E2E) is valid (pass), encoded F(UD+E2E), E2E(2), and ECC signature are written to the NVM (e.g., the memory array 120) as a codeword, at 1330. The write process ends.

In a read process, the codeword is read from the NVM at 1335 and decoded at 1340. After errors are fixed according to the ECC, F(UD+E2E) with E2E(2) appended thereto is determined. F(UD+E2E) appended thereto is verified using E2E(2) signature at 1345. In response to determining that F(UD+E2E) is invalid (fail), the codeword is re-read from the NVM. In response to determining that F(UD+E2E) is valid (pass), F(UD+E2E) proceeds through the data path, until it reaches the host interface 105. Then, at 1350, F(UD+E2E) is run through the inverse function $F^{-1}$ using the same key, to generate the original UD and the E2E signature. The original UD is verified using E2E signature at 1355. In response to determining that the UD is invalid (fail), a read error is sent to the host 101. On the other hand, in response to determining that the UD is valid (pass), the UD is sent to the host 101, and the read process ends In a garbage collection process, F(UD+E2E) is to be written to a different, freshly erased block. Thus, in response to passing the check at 1345, F(UD+E2E) is to be encoded at 1320. Blocks 1325 and 1330 are then performed as described. As shown, the permanent soft error protection 1301 protects against soft errors (e.g., in the garbage collection process) occurring up to the point of the initial write can get (permanently) propagated as each garbage collection process is performed on the UD.

Given that certain type of memory such as the buffer memory (e.g., the SRAM 116, the DRAM 114, and so on) is sensitive to soft errors, traditionally, a dedicated ECC is added to the memory (e.g., by encoding user data during memory write and decoding the user data during memory read) to protect the memory from soft errors. In some cases, ECC memory can maintain a memory system immune to single-bit errors, such that the data read from each codeword is always the same as the data that had been written, even if one of the bits actually stored has been flipped to the wrong state. However, most non-ECC memory cannot detect errors, although some non-ECC memory with parity support allows detection but not correction. It is noted that the additional ECC logic on the memory itself increases the memory area and hurts synthesis timing convergence, thus limiting the memory access frequency.

As shown in FIG. 1, the DRAM 114 and the SRAM 116 are located along the data path 114 between the host interface 105 and the error correction system 120. In order to reduce the number of soft errors, an ECC can be added at ends of the data path 112 to reduce or eliminate soft errors in the SRAM 116 and the DRAM 114.

In that regard, FIG. 14 is a block diagram illustrating an example soft error detection structure 1400, according to some implementations. FIG. 15 is a flowchart diagram illustrating an example method 1500 for writing data using the soft error detection structure 1400, according to some implementations. Referring to FIGS. 1-15, the soft error detection structure 1400 illustrate an example mechanism by which data is processed and protected between the host 101 and the memory array 150. The method 1500 is performed by the controller 110 in a write operation.

At 1505, the controller 110 (e.g., the host interface 105) receives user data 210 to be written from the host 101. The user data 210 can also be referred to as information bits. At 1510, the controller 110 generates a signature D3 1420 using the user data 210, in response to receiving the user data 210 at the host interface 105. In some examples, D3 1420 is generated using the host interface 105 before the user data 210 is processed through the data path 112. An example of D3 1420 includes redundancy bits generated using a Single-Error Correction and Double-Error Detection (SECDED) Hamming code. SECDED Hamming code is an ECC that allows a single-bit error to be corrected and a double-bit error to be detected.

At 1515, the controller 110 processes the user data 210 through the data path 112 (the write data path 126). For example, the user data 210 can be temporarily stored in a write buffer (e.g., in one or more of the DRAM 114 or the SRAM 116), and can be communicated via the bus/channel of the write data path 126 until the data reaches the error correction system 120.

Before the error correction system 120 (the encoder 122) receives the user data 210 via the write data path 126, the controller 110 determines whether the user data 210 is validated using D3 1420. Validating the user data 210 using D3 1420 corresponds to determining that no soft errors had occurred while the user data 210 is being processed along the write data path 126 (e.g., in the buffer memory such as but not limited to, the DRAM 114 and SRAM 116), between the host interface 105 and the encoder 122. On the other hand, failure to validate the user data 210 using D3 1420 corresponds to detecting that at least one soft error had occurred while the user data 210 is being processed along the write data path 126, between the host interface 105 and the encoder 122. In response to determining that based on D3 1420, the user data 210 is not validated (1520:NO), the controller 110 can correct the soft error using D3 1420 (e.g., by virtue of the SECED, if the error is a single-bit error) at 1525, and the method 1500 proceeds to 1530. In the cases in which the error is two or more bits, the controller 110 sends a write error indication to the host 101, through the host interface 105. The host 101 can attempt to rewrite the user data 210 by sending, to the host interface 105, the user data 210 again with another write command.

In response to determining that, based on D3 1420, the user data 210 is validated (the same as what had been received from the host at 1505) (1520:YES), at 1530, the controller 110 (e.g., the encoder 122) generates a signature D2 230 using the user data 210, as part of an encoding process. The encoder 122 appends D2 230 to the user data 210, at 1535. Furthermore, the encoder 112 generates, using one or more suitable ECCs, a codeword using the user data 210 (input payload) with D2 230 (redundancy bits) appended thereto, at 1540. At 1545, the controller 110 writes the codeword to non-volatile memory (e.g., the memory array 130). For example, the encoder 122 provides the codeword to the flash interface 118, while schedules the write operation that writes the codeword to one or more of the NAND flash memory devices 135. D3 1420 is not stored in the memory array 130. Accordingly, what is stored in the memory array 130 is a codeword generated from the user data 210 and D2 230.

Figure 16:
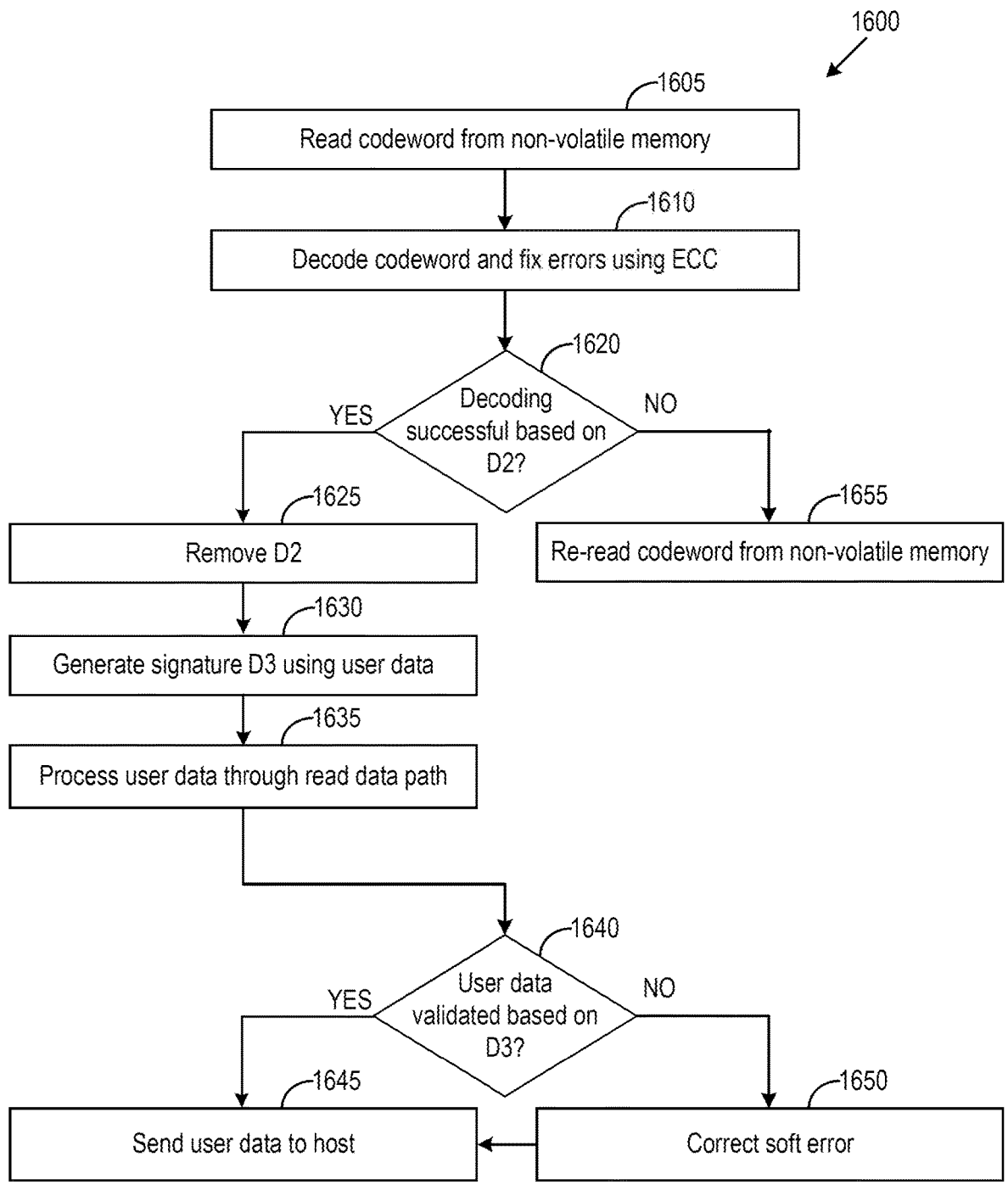
FIG. 16 is a flowchart diagram illustrating an example method for reading data using the soft error detection structure of FIG. 15, according to some implementations.

FIG. 16 is a flowchart diagram illustrating an example method 1600 for reading data using the soft error detection structure 1400, according to some implementations. Referring to FIGS. 1-16, the method 1600 is performed by the controller 110 in a read operation.

At 1605, the controller 110 (e.g., the flash interface 118) reads the codeword from non-volatile memory (e.g., the memory array 130), in response to a read command received from the host 101. At 1610, the controller 110 (e.g., the error correction system 120) decodes the codeword and fixes errors using ECC. For example, the decoder 124 can decode the codeword using the one or more ECCs used by the encoder 122 in the encoding process, to fix any errors in the user data 210 with D2 230 appended thereto. After error detection and correction are performed using ECC, the user data 210 and D2 230 can be identified.

At 1620, the controller 110 (e.g., the error correction system 120) determines whether decoding is successful based on D2 230. In some examples, 1620 is performed after errors are detected and fixed using ECC (at 1610). Given that an example of D2 230 is CRC redundancy bits, the decoder 124 can determine whether decoding is successful using the CRC redundancy bits. In response to determining that based on D2 230, the decoding is not successful (1620:NO), at 1655, the controller 110 (the flash interface 118) can perform a read-retry operation in which the same codeword is again read from the same physical address in the memory array 130, and the method 1600 returns at 1605. On the other hand, in response to determining that decoding is successful based on D2 230 (1620:YES), the controller 110 (the decoder 124) removes D2, at 1625.

At 1630, the controller 110 generates a signature D3 1420 using the user data 210, in response to D2 230 being removed from the user data 210. As described, an example of D3 1420 includes redundancy bits generated using a SECDED Hamming code. D3 1420 generated at 1630 and D3 1420 generated at 1510 may be a same set of redundancy bits or a different set of redundancy bits, in some examples. In further examples, D3 1420 generated at 1630 and D3 1420 generated at 1510 may be generated using different types of ECC codes (e.g., different types of SECDED codes) or using different algorithms.

At 1635, the controller 110 processes the user data 210 through the data path 112 (the read data path 128). For example, the user data 210 can be temporarily stored in a read buffer (e.g., in one or more of the DRAM 116 or the SRAM 116), and can be communicated via the bus/channel of the read data path 128 until the data reaches the host interface 105.

Before the host interface 105 receives the user data 210 via the read data path 128, at 1640, the controller 110 (e.g., the host interface 105) determines whether the user data 210 is validated using D3 1420. Validating the user data 210 using D3 141420 corresponds to determining that no soft errors had occurred while the user data 210 is being processed along the read data path 128, between the host interface 105 and the decoder 124. On the other hand, failure to validate the user data 210 using D1 1420 corresponds to detecting that at least one soft error had occurred while the user data 210 is being processed along the read data path 128, between the host interface 105 and the decoder 124. In response to determining that based on D3 1420, the user data 210 is not validated (1640:NO), the controller 110 can correct the soft error using D3 1420 (e.g., by virtue of the SECED, if the error is a single-bit error) at 1650, and the method 1600 proceeds to 1645. In the cases in which the error is two or more bits, the controller 110 sends a read error indication to the host 101, through the host interface 105.

In response to determining that, based on D3 1420, the user data 210 is validated (the same as what had been received from the host at 1505) (1640:YES), the controller 110 sends the user data 210 back to the host 101, through the host interface 105, at 1645.

Accordingly, in the mechanisms disclosed with respect to FIGS. 14-16, D3 1420 (e.g., the SECDED redundancy) is not stored to the memory array 150. Thus, the code rate is unchanged. Furthermore, if a single-bit soft error is detected, the controller 110 can correct the error in real-time without requesting the host 101 to resend the data. Dedicated protection on the DRAM 114 or the SRAM 116 is not needed.

While user data is used herein to refer to the original data, the disclosed processes can be implemented using input data. Examples of the input data include but not limited to, user data received from a host, internal controller data (e.g., data from an internal process such as data refresh in which data that has been stored in the memory array 120 for a long time and is likely to suffer from retention errors is read and written to a new page/block), data involved in a garbage collection (e.g., data from valid pages is read and written to newly erased block), and so on.

Figures 17, 18:
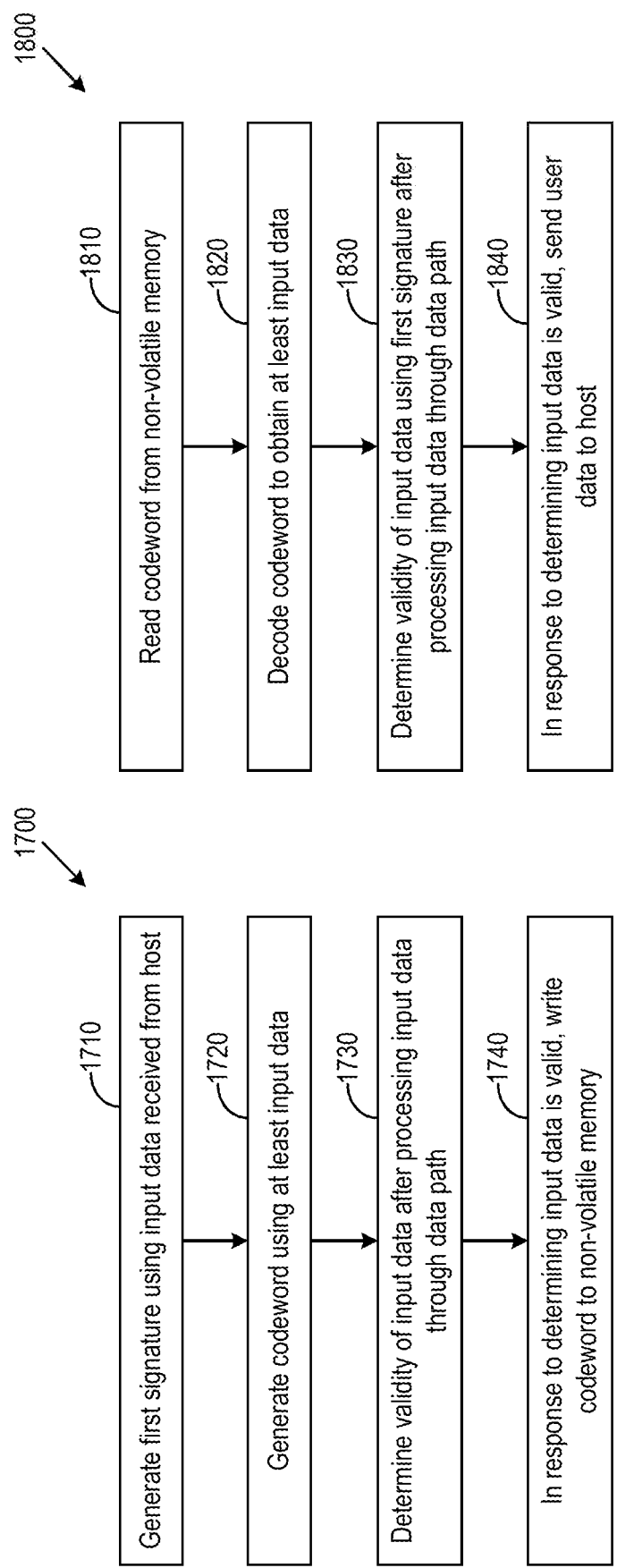
FIG. 17 is a flowchart diagram illustrating an example method for writing data using the soft error detection structures disclosed herein, according to some implementations.
FIG. 18 is a flowchart diagram illustrating an example method for reading data using the soft error detection structures disclosed herein, according to some implementations.

FIG. 17 is a flowchart diagram illustrating an example method 1500 for writing data using the soft error detection structures (e.g., 200, 600, 1000, 1400), disclosed herein, according to some implementations. Methods 300, 700, 1100, and 1500 are particular implementations of the method 1700. At 1710, the controller 110 generate a first signature using the input data 210 received from the host 101. At 1720, the controller 110 generates a codeword using at least the input data. At 1730, the controller 110 determines validity of the input data after processing the input data through the data path 112. At 1740, in response to determining that the input data is valid, the controller 110 writes the codeword to a non-volatile memory (e.g., the memory array 130).

FIG. 18 is a flowchart diagram illustrating an example method 1800 for reading data using the soft error detection structures (e.g., 200, 600, 1000, 1400) disclosed herein, according to some implementations. Methods 400, 800, 1200, and 1600 are particular implementations of the method 1800. At 1810, the controller 110 reads a codeword from a non-volatile memory (e.g., the memory array 130). At 1820, the controller 110 decodes the codeword to obtain at least the input data. At 1830, the controller 110 determines validity of the input data using a first signature after processing the input data through the data path 112. At 1840, in response to determining that the input data is valid using the first signature, send the input data to the host 101.

Accordingly, in the arrangements disclosed herein, the overhead is not increased for detecting and correcting soft errors on data that is programmed to the memory array 130. The examples of the write flow as described herein can detect and correct any soft error during the write flow and/or garbage collection, thus preventing any data with soft errors from being written to the memory array 130. The ECC error correction capability can be improved by optimizing utilization of parity data of E2E error detection and ECC. Dedicated ECC for each memory in the data path can also be reduced. Furthermore, a joint optimization of data path protection and NAND storage area utilization can be enabled.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of steps in the processes disclosed is an example of illustrative approaches. Based upon design preferences, it is understood that the specific order or hierarchy of steps in the processes may be rearranged while remaining within the scope of the previous description. The accompanying method claims present elements of the various steps in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the steps of various examples must be performed in the order presented. As will be appreciated by one of skill in the art the order of steps in the foregoing examples may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In some exemplary examples, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical drive storage, magnetic drive storage or other magnetic storages, or any other medium that may be used to store desired program code in the form of instructions or data structures and that may be accessed by a computer. Drive and disc, as used herein, includes compact disc (CD), laser disc, optical disc, digital versatile disc (DVD), floppy drive, and blu-ray disc where drives usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A non-transitory processor-readable media comprising processor-readable instructions, such that, when executed by at least one processor of a controller, causes the processor to:
   generate a first signature using input data received from a host;
   generate a codeword using at least the input data;
   determine validity of the input data after processing the input data through a data path; and
   in response to determining that the input data is valid, write the codeword to a non-volatile memory.

2. The non-transitory processor-readable media of claim 1, wherein when the processor-readable instructions are executed by the at least one processor, the processor is further caused to:
   after generating the first signature, process the input data through the data path; and
   generating a second signature using the input data after processing the input data through the data path, wherein
   the codeword is generated using the input data and the second signature appended to the input data.

3. The non-transitory processor-readable media of claim 2, wherein
   the first signature is a first Cyclic Redundancy Check-Sum (CRC) signature; and
   the second signature is a second CRC signature.

4. The non-transitory processor-readable media of claim 2, wherein a frame size used to generate the first signature is different from a frame size used to generate the second signature.

5. The non-transitory processor-readable media of claim 1, wherein the codeword is generated before determining the validity of the input data using the first signature.

6. The non-transitory processor-readable media of claim 1, wherein when the processor-readable instructions are executed by the at least one processor, the processor is further caused to:
   append the first signature to the input data;
   determine function output data based on the input data with the first signature appended thereto using a first function and a key; and
   process the input data through a data path comprises processing the function output data through the data path, wherein
   the codeword is generated using the function output data.

7. The non-transitory processor-readable media of claim 6, wherein determining the validity of the input data using the first signature comprises determining the input data based on the function output data using a second function and the key, the second function being an inverse function of the first function.

8. The non-transitory processor-readable media of claim 1, wherein when the processor-readable instructions are executed by the at least one processor, the processor is further caused to:
   append the first signature to the input data;
   determine function output data based on the input data with the first signature appended thereto using a first function and a key;
   generate a second signature using the function output data;
   generate the codeword comprises encoding the function output data with the second signature appended to the function output data; and
   process the input data through the data path comprises processing the function output data with the second signature appended thereto through the data path.

9. The non-transitory processor-readable media of claim 8, wherein determining the validity of the input data using the first signature comprises determining the input data based on the function output data using a second function and the key, the second function being an inverse function of the first function.

10. The non-transitory processor-readable media of claim 1, wherein
    the validity of the input data is determined using the first signature;
    and wherein when the processor-readable instructions are executed by the at least one processor, the processor is further caused to:
       generate a second signature using the input data after determining that the input data is valid using the first signature; and
       append the second signature to the input data; and
    the codeword is generated based on the input data and the second signature appended to the input data.

11. The non-transitory processor-readable media of claim 10, wherein
    the first signature is generated using a Single-Error Correction and Double-Error Detection (SECDED) Hamming code; and
    the second signature is a Cyclic Redundancy Check-Sum (CRC) signature.

12. A storage device, comprising:
    a non-volatile memory;
    a controller configured to:

generate a first signature using input data received from a host;

generate a codeword using at least the input data;

determine validity of the input data after processing the input data through a data path; and in response to determining that the input data is valid, write the codeword to the non-volatile memory.

13. The storage device of claim 12, wherein the controller is further configured to:

after generating the first signature, process the input data through the data path; and generating a second signature using the input data after processing the input data through the data path, wherein the codeword is generated using the input data and the second signature appended to the input data.

14. The storage device of claim 13, wherein the first signature is a first Cyclic Redundancy Check-Sum (CRC) signature; and the second signature is a second CRC signature.

15. The storage device of claim 13, wherein a frame size used to generate the first signature is different from a frame size used to generate the second signature.

16. The storage device of claim 12, wherein the codeword is generated before determining the validity of the input data using the first signature.

17. The storage device of claim 12, wherein the controller is further configured to:

append the first signature to the input data;

determine function output data based on the input data with the first signature appended thereto using a first function and a key; and process the input data through a data path comprises processing the function output data through the data path, wherein the codeword is generated using the function output data.

18. The storage device of claim 17, wherein determining the validity of the input data using the first signature comprises determining the input data based on the function output data using a second function and the key, the second function being an inverse function of the first function.

* * * * *